US010765045B1

(12) United States Patent
Hector

(10) Patent No.: US 10,765,045 B1
(45) Date of Patent: Sep. 1, 2020

(54) ELECTROMAGNETIC PULSE (EMP) PROTECTIVE COMPOSITE ENCLOSURE PANEL SYSTEM AND EMP PROTECTIVE BUILDING STRUCTURES AND SYSTEMS

(71) Applicant: GO TEAM CCR, LLC, Raleigh, NC (US)

(72) Inventor: Francis Norbert Hector, Raleigh, NC (US)

(73) Assignee: Go Team CCR, LLC, Raleigh, NC (US)

( * ) Notice: Subject to any disclaimer, the term of this patent is extended or adjusted under 35 U.S.C. 154(b) by 0 days.

(21) Appl. No.: 16/711,581

(22) Filed: Dec. 12, 2019

Related U.S. Application Data

(60) Provisional application No. 62/883,696, filed on Aug. 7, 2019, provisional application No. 62/863,394, filed on Jun. 19, 2019.

(51) Int. Cl.
*H05K 9/00* (2006.01)
(52) U.S. Cl.
CPC .................. *H05K 9/0003* (2013.01)
(58) Field of Classification Search
CPC .................................................. H05K 9/0003
See application file for complete search history.

(56) References Cited

U.S. PATENT DOCUMENTS

| | | | | |
|---|---|---|---|---|
| 3,092,218 | A * | 6/1963 | Clay | H05K 9/0015 52/460 |
| 2007/0062151 | A1* | 3/2007 | Smith | B28B 1/503 52/782.1 |
| 2011/0048219 | A1* | 3/2011 | Pyles | E04C 2/20 89/36.01 |
| 2016/0234977 | A1* | 8/2016 | Tuan | H05K 9/0003 |

* cited by examiner

*Primary Examiner* — Hung V Ngo
(74) *Attorney, Agent, or Firm* — Shumaker, Loop & Kendrick, LLP

(57) ABSTRACT

An EMP-protective composite structure that includes at least one enclosure having walls, a ceiling, at least one ingress/egress portal and a base, each of the walls, the ceiling, the ingress/egress portal and the base including at least one blast-resistant structural panel and at least one layer of an EMP barrier that provides magnetic conduction, field absorption and field reflection fully-enclosing the structural panel. An encapsulation barrier is provided having a blast-deflecting surface overlying the at least one enclosure. A HEMP door or circuitous path is provided from an exterior of the EMP-protective structure, through the encapsulation barrier and to the at least one ingress/egress portal of the enclosure. The circuitous path is configured to absorb and deflect EMP as the EMP passes along the circuitous path. Embodiments of the blast-resistant structural panel are also disclosed.

16 Claims, 18 Drawing Sheets

ELECTROMAGNETIC PULSE (EMP) PROTECTIVE COMPOSITE ENCLOSURE PANEL SYSTEM AND EMP PROTECTIVE BUILDING STRUCTURES AND SYSTEMS

CROSS REFERENCE TO RELATED PATENT APPLICATIONS

This application claims the benefit of and priority to U.S. Provisional Patent Application No. 62/883,696 filed Aug. 7, 2019, herein expressly incorporated by reference in its entirety.

TECHNICAL FIELD AND BACKGROUND OF THE INVENTION

This invention relates to the novel use of engineered composite systems that are formulated and applied in building structures using common and special construction materials in unique and distinct combinations. The materials and processes produce a very cost effective structure with superior Electromagnetic Pulse (EMP) protective attributes with shorter construction time than structures that are currently being used for EMP protection structures and systems. The EMP Protective composite enclosure panel systems and materials in this application have unique features that allow for, if required, exceptional corrective and maintenance work which can be easily located and performed to allow for long-term Intentional Electro Magnetic Interference (IEMI) and EMP shielding, absorption and conductivity protection requirements of the system(s) for many decades, if not longer, to come.

With the increase in awareness and interest in the United States of America's national security as detailed in the President Trump's Executive Order on Coordinating National Resilience to Electromagnetic Pulses dated Mar. 26, 2019 and with the two Electromagnetic Defense Task Force reports from the USAF LeMay Center for Doctrine Development and Education, report 1.0 issued in 2108, and another report in 2019 and with several congressional hearings' testimony on the devastating consequences of a man-made Electromagnetic Pulse (EMP) or a naturally occurring Geomagnetic Disturbances (GMD) event occurring in the United States, there has recently been a keen interest from governmental departments, agencies, public utilities and investor owned utilities (IOU) on how best to provide high quality and cost effective EMP protective structures and systems.

U.S. Pat. No. 9,790,703, "Methods of Utilizing Coal Combustion Residuals and Structures Constructed using such Coal Combustion Residuals", discloses structures suitable for EMP protected structures. There is a need for not only the Coal Combustion Residuals EMP protective structures under U.S. Pat. No. 9,790,703, but there is also the need for other types of EMP protective structures and systems.

The majority of recently built EMP protective structures are presently constructed by one of two methods. The most common currently used method is a system disclosed in U.S. Pat. No. 8,968,461 licensed to Omni-Threat Structures (OTS) by the University of Nebraska which is centered around an electrically-conductive concrete mix design, also sponsored by the US Government.

Additionally, OTS has licensed U.S. Pat. No. 9,681,592 from the University of Nebraska. This patent discloses a magnetic conductive material that is embedded in the electrically-conductive concrete. This technology was also sponsored by the US Government.

A second type of EMP protection system is also currently an option in the marketplace. This method includes the use of a composite panel system made of light gauge metal with a high-density wood core which is mechanically fastened or connected with welded light-gauge joints with a ½ inch thick cement backer board that is used for protection of the components during the welding process. A mechanically fastened option available from Braden Shielding Systems was used for Dominion Energy's System Operation Center (SOC) which opened in August 2017 and is hardened against natural and man-made EMP threats. "The center includes a MIL-SPEC EMP space for critical operations and employs the latest technologies and practices in physical and cyber security, telecommunications, redundancy and efficiency," as stated by David W. Roop, P.E. with Dominion Energy in testimony before the Committee on Homeland Security and Governmental Affairs, Feb. 27, 2019.

In the Braden Shielding approach, a non-loadbearing EMP protective system is constructed inside a traditional building, which is a very different method than the load bearing structure approach found in the University of Nebraska patent that is used by OTS. The shielding that Braden Shielding Systems, as used in the Dominion Energy project is comparable to other shielding systems in the marketplace, such as ETS-Lindgren which utilized a composite panel system to construct a HEMP shielded facility in Houston, Tex. for Centerpoint Energy.

ETS Lindgren provides a composite system which is constructed with Laminated Veneer Lumber (LVL) and galvanized steel which is mechanically fastened. In addition, brass wool and copper tape is used to cover the mechanically-fastened seams.

At least one other vendor also provides composite panel shielding systems—Universal Shielding.

Several other older patents also disclose conductive cement-based compositions, e.g., U.S. Pat. Nos. 5,447,564, 3,166,518, and Canadian Patent 2404513.

Regarding the Braden Shielding and ETS-Lindgren approaches, the use of non-durable brass wool and copper tape as integral shielding elements and their cost affordability impediments along with their long-term integrity concerns for large scale projects using light-gauged metal and wood composite panels, the (MIL-HDBK-1195) cautions against the use of mechanically-fastened panel shielding systems, largely due to the expense of maintenance and questionable durability. These designs are not load-bearing structural panels that become part of the structural components of the structure. Quality control, excessive cost to construct and scheduling challenges with the multiple meshes embedded in conductive concrete as outlined in the University of Nebraska patents present other considerations.

Man-made EMP created by the detonation of a nuclear weapon above the earth surface will create electromagnetic forces that have different frequency ranges and different rates of onset time, duration and intensity which cause the electrical and magnetic forces to arrive to a definite point in space at different times and with different types of energy and different field strengths of energy.

These different Electrical and Magnetic energy levels are referred to in the scientific community as E1, E2, and E3. To protect against the negative forces of an EMP, engineers knowledgeable in EMP protection design features to provide protection of vulnerable components, items, and/or equipment by either absorption, shielding or reflection, or a combination of all three methods to protect components from damage by an EMP event. A building must be protected against an EMP event on all sides of the structure, including from the underside of the structure, as well as the roof level, in addition to all vertical or slanted sides of the structure.

There are two known composite steel and concrete systems that are not designed for and do not provide EMP protection. These composite steel/concrete systems are designed for an entirely different purpose, which is to speed the construction schedule of mid-rise and high-rise buildings and are not designed to provide for, nor do they provide, EMP protection. One system is referred to as AISC "Speed Core" and the other system is referred to as REDICOR and is manufactured by Vulcraft, a unit of NuCor Steel.

Panels in accordance with the disclosure of this application can be fabricated using what is a known construction method called "tilt-up" concrete wall panel construction, practiced by, for example, Dayton Superior. Tilt-up concrete wall panel construction methods include a casting bed, which is commonly the slab on grade of the building. Once a casting bed is constructed, the perimeter of the panels are typically formed with temporary wood or metal forms to hold the concrete in place after the reinforcing steel bars or welded wire fabric is installed. The reinforcements are placed in the forms; the concrete is poured, finished and cured. After the concrete reaches the required strength, the panels will be lifted (tilted-up) from the slab with a crane and then set into place and braced until other parts of the structure are assembled or constructed which will permanently secure the complete building structure and join the tilt-up concrete panels together.

SUMMARY OF THE INVENTION

Therefore, according to one aspect of the invention, an EMP-resistant construction provides high electromagnetic protection performance with high quality and cost effectiveness. The constructions are robust and easily maintained, allowing for shortened construction duration, a low degree of construction difficulty, and multiple layers of protection depending on the end user's specifications.

According to another aspect of the invention, additionally many design layouts are possible with adaptability for many different sizes and shapes, multiple levels, aboveground, underground and shapes for governmental, military and private entities.

According to another aspect of the invention, the enclosure panel invention described in this application provides all three methods of EMP protection (magnetic conduction, field absorption and field reflection) by itself, or it can be applied in a structural component application such as the OTS system, in a non-structural interior application as the interior shielding methods as offered by Braden Shielding or the ETS-Lindgren systems.

According to an aspect of the invention, a further differentiator of the EMP protective composite enclosure panel systems disclosed in this application is that in addition to vertical or slanted wall surfaces, the panels can be used as part of, or below the ground floor slab, on top of or underneath the earth below the slab on grade, and/or on the roof of a structure, which roof does not necessarily have to be level in plane. The formulation(s) and application(s) used to construct the inventions according to this application are different from either of the two above-mentioned methods used for EMP protection which are currently on the market.

According to another aspect of this invention a novel approach is provided to construct an EMP protective composite enclosure panel system (enclosure panels) using steel and concrete to provide an enclosure panel that can be used for any surface of a building structure including walls, floor(s) and/or roofs. The panels can be used above grade or below grade and as a protection layer underneath the slab on grade in many different applications or as part of the slab on grade. These panels will provide different levels of EMP protection based on the type and thickness of concrete that is used and upon the type and thickness of the steel which is used in conjunction with the concrete.

According to another aspect of the invention, a multi-layered approach is disclosed which will provide even greater protection from man-made IEMI and EMP events as they currently exist, and/or the ability to withstand greater negative forces as weapon systems advancements are introduced.

Therefore, in accordance with one embodiment of the invention, an EMP-protective composite structure includes at least one enclosure having walls, a ceiling, at least one ingress/egress portal and a base, each of the walls, the ceiling, the ingress/egress portal and the base including at least one blast-resistant structural panel and at least one layer of an EMP barrier that provides magnetic conduction, field absorption and field reflection fully-enclosing the structural panel. An encapsulation barrier is provided having a blast-deflecting surface overlying the at least one enclosure. A circuitous path is provided from an exterior of the EMP-protective structure, through the encapsulation barrier and to the at least one ingress/egress portal of the enclosure. The circuitous path is configured in two parts. One part is configured to facilitate the absorption of higher frequency EMP energy in carbon-containing material as it passes along the length of the path entryway. The second part is configured to act as a "Waveguide Below Cutoff" preventing lower frequency EMP energy from traversing into protected spaces. In combination, the two parts of the circuitous path effectively block significant EMP energy from entering the protected/shielded space.

According to another embodiment of the invention, an EMP-protective composite structure is provided wherein the EMP barrier comprises CCR.

According to another embodiment of the invention, the encapsulation barrier is an overlying layer of an impermeable cementitious material.

According to another embodiment of the invention, the encapsulation barrier comprises an overlying layer of an impermeable cementitious material and a layer of vegetation overlying the layer of impermeable cementitious material.

According to another embodiment of the invention, the blast-deflecting surface defines an acute blast-deflecting angle with respect to a major plane of the base.

According to another embodiment of the invention, the blast-resistant structural panel includes a frame constructed of a spaced-apart frame members of a ferrous material, frame reinforcing members extending between and connecting the spaced-apart frame members, and a cementitious layer in which the frame is embedded.

According to another embodiment of the invention, an EMP reflecting mesh designed for low frequency energy that may pass through carbon-containing material is embedded in the cementitious layer.

According to another embodiment of the invention, the blast-resistant structural panel includes an expansion joint extending along a major side thereof for joining the structural panel to a like structural panel that allows for movement of the structural panel relative to other joined structural panels due to expansion and contraction while maintaining intact EMP protective features.

According to another embodiment of the invention, the circuitous path comprises a labyrinth having a plurality of right-angle turns, zig-zag turns, curves, or spirals (or a combination of these structures) though the EMP barrier that provides magnetic conduction (to prevent low-frequency EMP magnetic field energy from entering the protected space, electric field absorption and electric field reflection with respect to EMP electric and magnetic field energy entering the path from the exterior of the EMP-protective structure.

According to another embodiment of the invention, the enclosure includes a plurality of structural panels joined to form enclosed spaces equipped to perform the functions selected from the group of enclosed spaces consisting of operations center, living quarters, communications, data center, mess hall, kitchen facilities, restroom, shower facility, laundry, storage for food, water, medical supplies and equipment, apparel and hygiene-related supplies and equipment, generators, battery storage, transformers, power substation, power plant SCADA system; fuel supply, storage for spare and replacement parts for operating equipment.

According to another embodiment of the invention, an EMP-protective composite structure is provided that includes at least one enclosure having walls, a ceiling, at least one ingress/egress portal and a base, each of the walls, the ceiling, the ingress/egress portal and the base including at least one blast-resistant structural panel and at least one layer of an EMP barrier comprised of CCR that provides magnetic conduction, field absorption and field reflection fully-enclosing the structural panel. The blast-resistant structural panel includes a frame constructed of a spaced-apart frame members of a ferrous material, frame reinforcing members extending between and connecting the spaced-apart frame members. A cementitious layer is provided in which the frame is embedded and an EMP absorbing mesh is embedded in the cementitious layer.

According to another embodiment of the invention, the encapsulation barrier includes an overlying layer of an impermeable cementitious material having a blast-deflecting surface defining an acute blast-deflecting angle with respect to a major plane of the base overlying the at least one enclosure.

According to another embodiment of the invention, a circuitous path is provided from an exterior of the EMP-protective structure, through the encapsulation barrier and to the at least one ingress/egress portal of the enclosure. The circuitous path is configured to absorb and deflect EMP as the EMP passes along the circuitous path. The circuitous path defines a labyrinth having a plurality of right-angle, zigzag, curved and/or spiral turns though the EMP barrier that provide magnetic conduction, field absorption and field reflection with respect to EMP electric and magnetic field energy entering the path from the exterior of the EMP-protective structure.

According to another embodiment of the invention, the encapsulation barrier includes an overlying layer of an impermeable cementitious material and a layer of vegetation overlying the layer of impermeable cementitious material.

According to another embodiment of the invention, the blast-resistant structural panel includes an expansion joint extending along a major side thereof for joining the structural panel to a like structural panel that allows for movement of the structural panel relative to other joined structural panels due to expansion and contraction while maintaining intact EMP protective features.

According to another embodiment of the invention, enclosure includes a plurality of structural panels joined to form enclosed spaces equipped to perform the functions selected from the group of enclosed spaces consisting of operations center, living quarters, communications, data center, mess hall, kitchen facilities, restroom, shower facility, laundry, storage for food, water, medical supplies and equipment, apparel and hygiene-related supplies and equipment, generators, battery storage, transformers, power substation, power plant SCADA system; fuel supply, storage for spare and replacement parts for operating equipment.

According to another embodiment of the invention, a structural panel is provided for use in constructing an EMP-protective composite structure, and includes spaced-apart frame members of a ferrous material, frame reinforcing members extending between and connecting the spaced-apart frame members, and a cementitious layer in which the frame is embedded.

According to another embodiment of the invention, a low-frequency EMP conducting/reflecting mesh is embedded in the cementitious layer.

According to another embodiment of the invention, the blast-resistant structural panel includes an expansion joint extending along a major side thereof for joining the structural panel to a like structural panel that allows for movement of the structural panel relative to other joined structural panels due to expansion and contraction while maintaining intact EMP protective features.

According to another embodiment of the invention, an insulation layer coextensive with a major surface of the panel is provided.

According to another embodiment of the invention, the panel is adapted to be fabricated in a horizontal position and then tilted in situ into an upright position to form a part of the enclosure.

According to another embodiment of the invention, the cementitious layer is selected from the group consisting of lightweight concrete, epoxy concrete ultra-high performance concrete and autoclave concrete.

BRIEF DESCRIPTION OF THE DRAWINGS

The disclosure of the invention will be more fully understood if taken in connection with the following drawings, in which.

DETAILED DESCRIPTION OF PREFERRED EMBODIMENT AND BEST MODE

Figure 1:
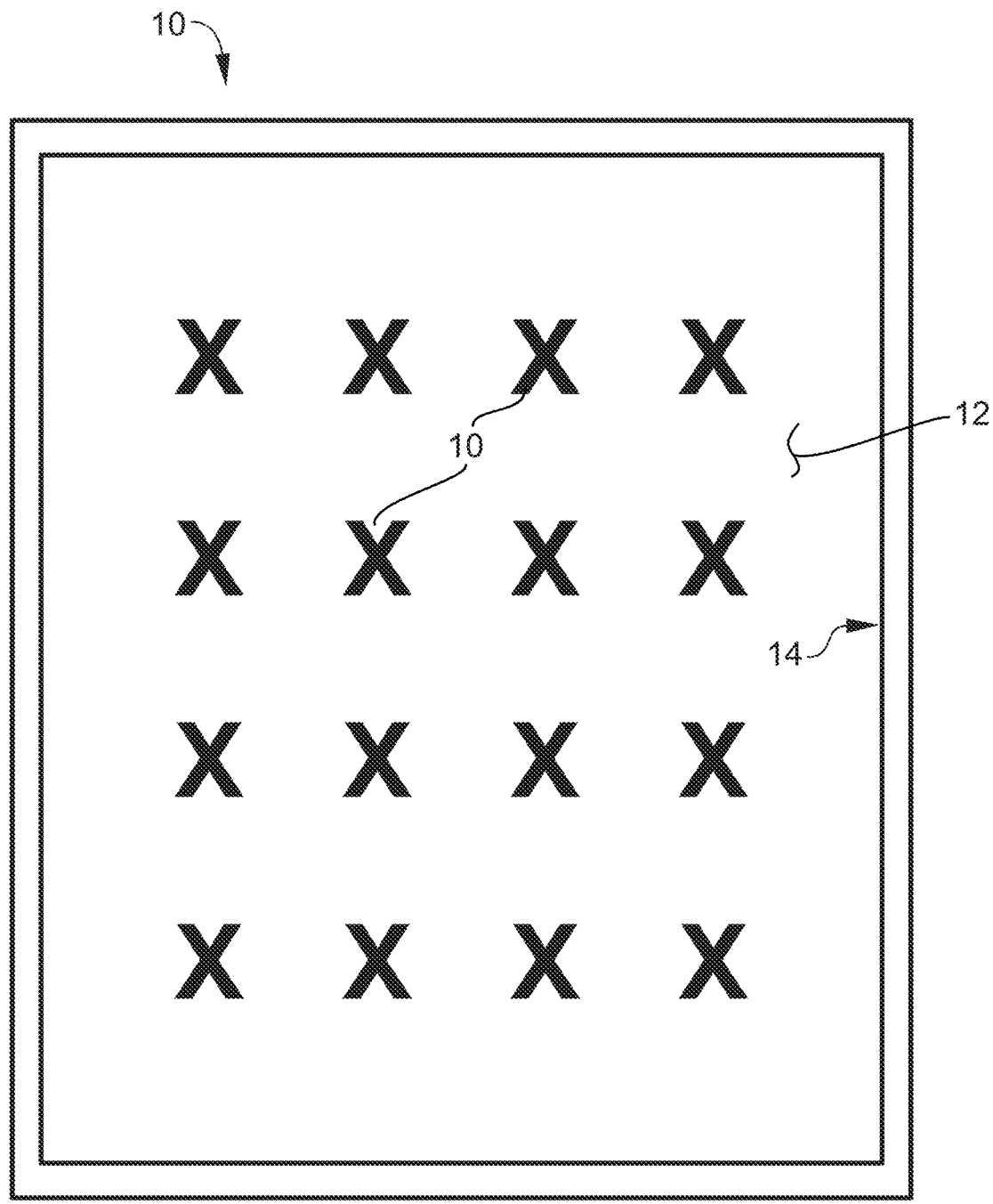
FIG. 1 is top plan view of an enclosure panel according to one embodiment of the invention showing horizontally-placed steel components before the concrete portion of the enclosure panel is placed into the panel enclosure.

Referring now to the drawings, FIG. 1 is a plan view of an EMP protective composite enclosure panel 10 according to one embodiment of the invention. The casting bed 12 can be a sheet of steel that will form an integral part of a composite wall panel system formed of a number of enclosure panels 10. FIG. 1 shows the horizontally placed steel components before the concrete component of the enclosure panel 10 is poured. Steel members 14, preferably C-channels, are attached to the perimeter of the steel sheet 12 as shown. The steel members 14 along with the steel sheet 12 are used to permanently attach the enclosure panels 10 together once the walls fabricated from the panels 10 are tilted up to their final location as described further below. The enclosure panels 10 have the added benefit that the C-channel steel members 14 can be used as the edge form for the concrete which will be poured into the enclosure panel 10.

Other types of steel members such as angles can be used or in heavy structural loading conditions, H-piles or wide flange beams are among other types that can be used. The number, thickness, type and size of steel member and their direction in the panels can vary depending on the design requirements.

In light structural loading conditions, the sides of the concrete in the panel 10 can be a temporary wood or steel forming system, and the welded components can be welded to the steel sheet 12 such that no side steel member 14 would be used in this design application. Nelson studs 16 can be attached to the back of the steel sheet 12 to form a structural connection for the concrete.

Figure 2:
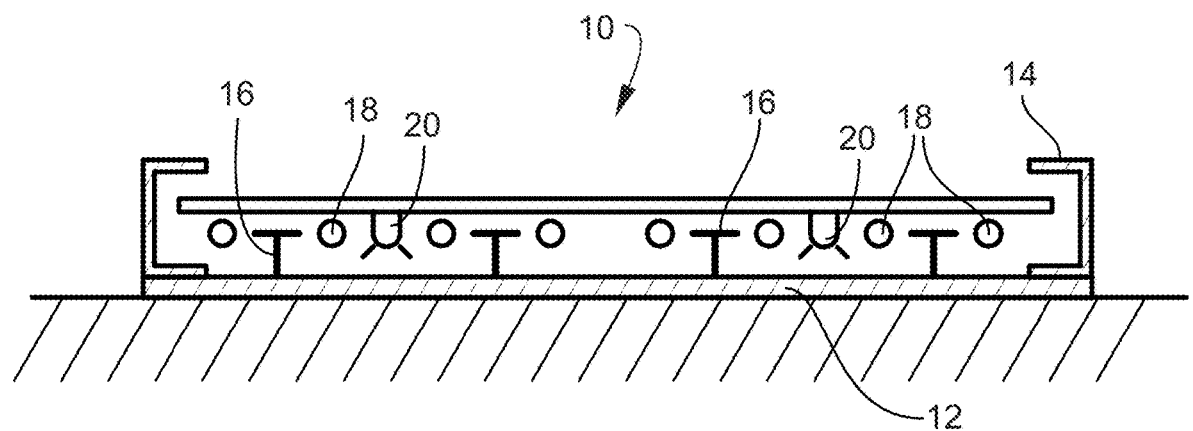
FIG. 2 is a cross-section of the horizontally placed steel components of the enclosure panel before the concrete is poured.
Figure 3:
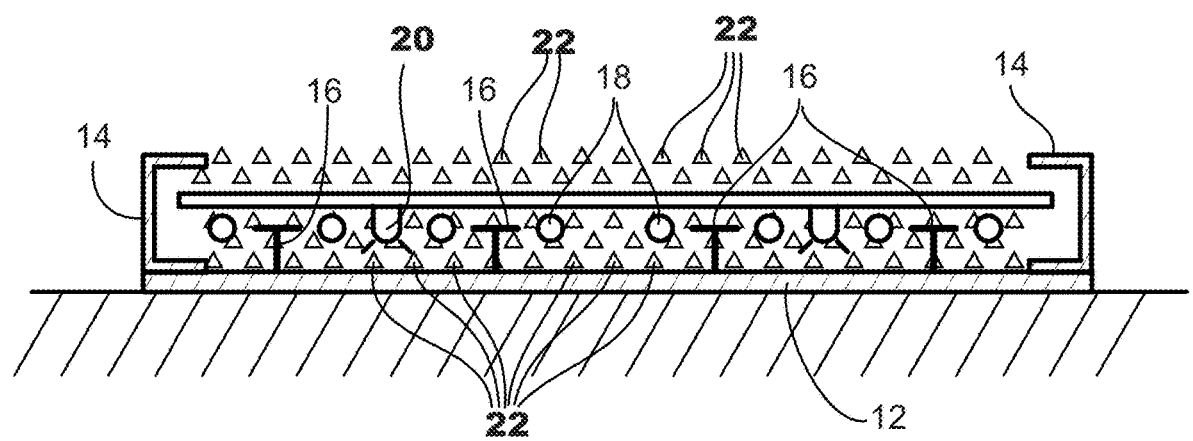
FIG. 3 is a plan view of the enclosure panel.

FIG. 2, shows a cross section of the horizontally placed steel components of the enclosure panel 10 before the concrete is placed being supported by "Earth" or the building's slab on grade. Concrete reinforcing bars 18 are placed in the panel 10 before the concrete is poured. The reinforcing bars in 18 structural load bearing panels 10 can be placed in both directions. Structural weld wire fabric (WWF) may also be used in lieu of the reinforcing bars 18 in some structural design applications. Tilt-up lifting inserts 20 and wall bracing inserts to temporarily hold the panels in place may be placed in the panels to facilitate the tilt-up process.

Once the lifting and bracing inserts 20 and reinforcing bars 18 are installed, if not integrated into the enclosure panel 10, concrete 22 is poured into the void defined by the perimeter C-channel steel members 14, vibrated to eliminate air and densify the concrete, and smoothed to a suitable surface finish. The concrete mix designs for the concrete used in the composite panels 10 will vary depending on the level of EMP protection required by the end user, the structural load that will be applied to the panel 10 in its intended design use, and the structural qualities and sizes of the steel components. As stated above, EMP protection is provided by the combination of conduction, absorption and reflection properties of materials.

A concrete mix design which includes carbon-based materials, some previously-patented concrete mix designs which are referenced in this application or a concrete mix design with similar capabilities can provide EMP protection based on the absorption capabilities of the carbon in the concrete and the conductivity of the steel fibers. A concrete mix design that includes steel fibers will add conduction capabilities to the concrete which protects against EMP. Contingent on the thickness and type of the steel components in the composite panel 10's design, the EMP protection capabilities of the concrete can be redundant features of the composite panel 10, or they can be primary features if the concrete 22 is conductive with steel fibers in the concrete portion of the composite panels and includes carbon in the concrete mix design for absorption capabilities as described in this application.

If the steel is of a required thickness, the concrete 22 can be a structural component without carbon or steel fibers offering very limited EMP protection itself, but with the EMP protection being provided by the steel components when installed in a continuous welded or a structurally mechanically connected fashion as detailed below in this application.

Once the concrete 22 has cured to the point obtaining the required structural strength, the panels will be tilted-up and temporarily braced until the other components of the structure are assembled and/or constructed, at which time the panels 10 will be permanently connected and secured in place with structural components of the facility. The steel components of the composite panels 10 can be placed on the interior or exterior side of the side of the structure.

Figure 4:
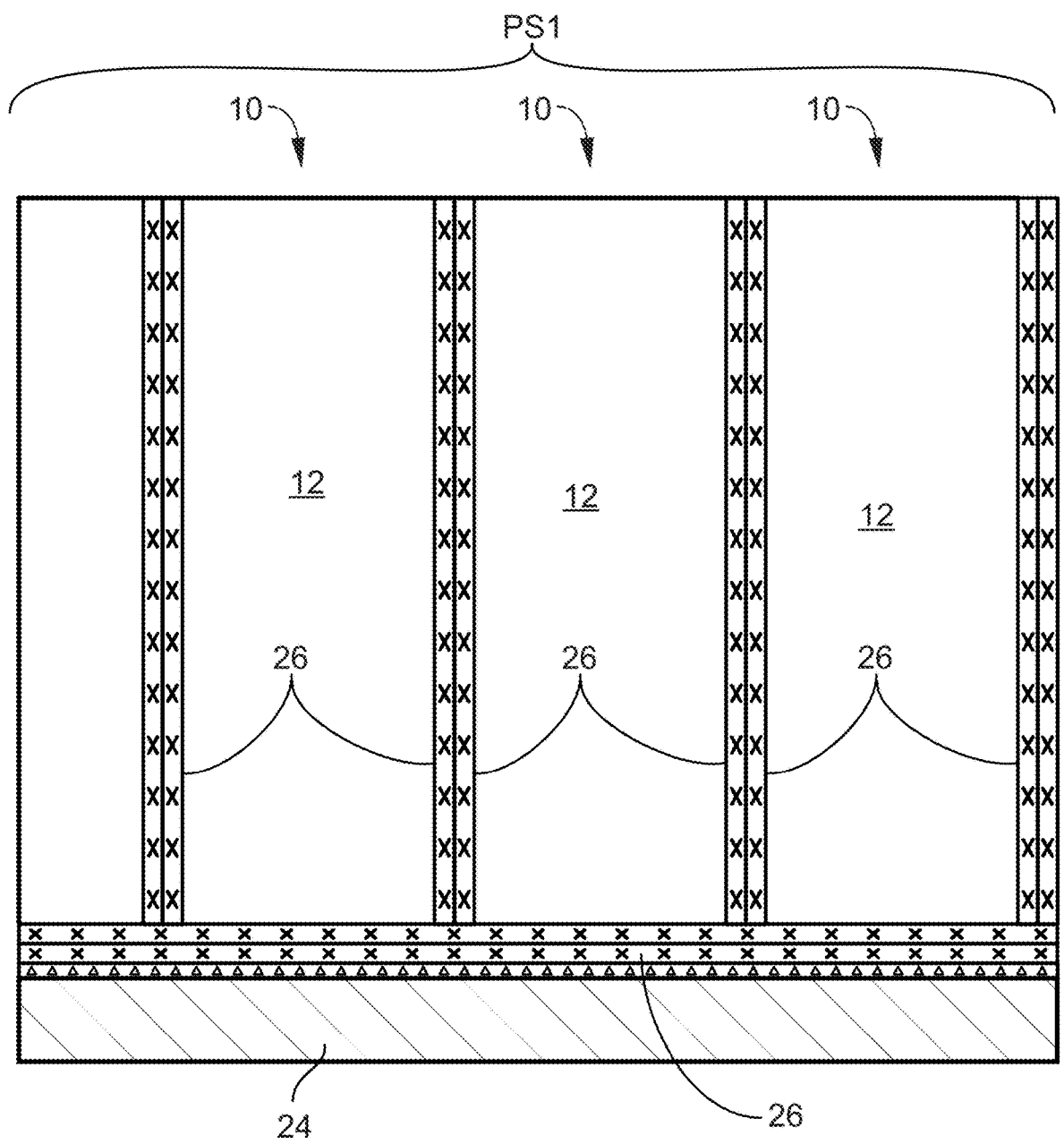
FIG. 4 is an elevation view of an EMP protective composite wall panel system formed of a series of enclosure panels according to one embodiment of the invention.

FIG. 4 shows the elevation view of the EMP protective composite wall panel system PS1 formed of a series of panels 10 that are erected and connected side-by-side. In the embodiment of FIG. 4, the panels 10 have the steel sheet casting bed 12 on the interior side of the structure and resting on a concrete foundation system 24. The composite panels 10 will be welded in a continuous fashion using an angle iron or other metal shape to connect the panel to the foundation which will have a metal structural component 26 that is designed and constructed as part of the foundation system which can work for both structural and EMP protection purposes.

A flat bar of steel 26 can be continuously welded to each panel 10 to create a solid metal connection which will allow for electrical/magnetic conductivity, shielding and absorption. EMP protective roof and floor systems will be described later in this application, which when taken in their entirety and connect to the panel system will provide several different options to provide a complete EMP protective system(s) for building structures using the composite panels 10 disclosed in this invention.

The EMP protective enclosure composite panels 10 can be used above grade, below grade or a mixture of both in a structure, both in a horizontal, vertical or angled position. One advantage of having the steel components of the panels 10 placed on the inside of a structure is that over several decades, if the steel needs to be repaired it can be easily accessed. If the steel is placed to the exterior and it is used above or below grade, the steel can be coated with corrosion protective materials in addition to architecturally design materials. The steel can also be galvanized on the exterior, if required, with the welding of the panels 10 taking place on the interior portion of the C-channel steel members 14, which can be painted, ungalvanized steel. If the concrete 22 is on the exterior side of the structure and is below grade, concrete protective liners can be used. Architectural form liners can be used when the end user specifies a more decorative finish, using a product as produced by Sika Greenstreak form liners.

FIG. 4 shows the panels 10 being placed in the vertical direction, but the panels 10 can be placed horizontally as well. In multi-level structures, panels 10 can be stacked on top of each other in a load-bearing fashion or supported by other structural components of the building, which allows the structural engineers and architects design flexibility.

Figure 5:
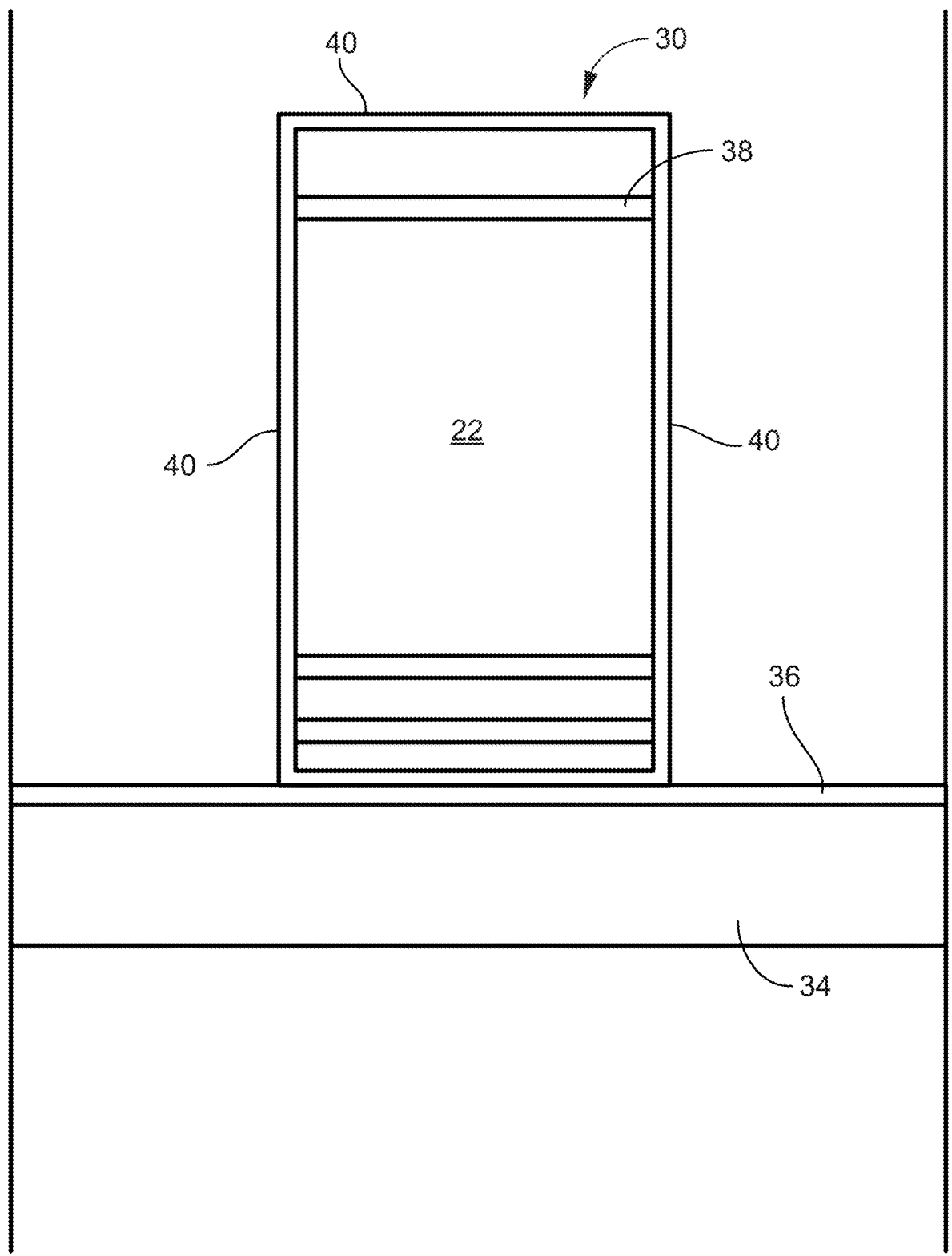
FIG. 5 shows an EMP protective composite panel with an interior side of concrete.

FIG. 5 shows an EMP protective composite panel 30 when the interior side is concrete 22. Embedded in the concrete 22 can be continuous metal flat bar located between the foundation 34, and the slab-on grade 36 at ground level. Another flat bar 38 at the roof level can be embedded in the concrete side of the panel 30 for welding of other EMP protective composite panels or other EMP protective features as described further below in this application.

Another option for the welding of other roof protective features is the top of the C channel steel member 40. The EMP protective concrete panel 30 can be welded to the foundation metal connection point 36 in a continuous fashion to the bottom C channel steel member 40. Other features described below will provide the required EMP protection from the negative EMP effects passing beneath the ground, if not protected against, will enter the structure from its bottom side. The steel front side of the composite panel 10 that is placed on the exterior of the building may be placed under carbon-containing materials such as coke breeze, coal combustion residuals (CCR), soil or other materials, or exposed to the outdoors. The optional steel protective coatings addressed above will allow for corrosion protection in unfavorable climate conditions, high moisture content materials, salt air, or the CCR which may have a corrosive PH balance.

The above described method of using tilt-up construction is not intended to limit the means and methods of construction with which the enclosure panels may be constructed. The advantage of tilt-up construction is that the cost of transporting the weight of the concrete portion of the panel system is eliminated, in that ready-mix concrete will be either be batched on-site or purchased from a local ready-mix concrete supplier. In some instances, for an expedited construction project, it may be optimal to fabricate the panels in their entirety off-site and erect and secure the enclosure panels system together once the panels are delivered to the building site. Another option is to use the metal sheet portion of the enclosure panel's composite panel system as one side of a poured-in-place concrete form and place the ready-mixed concrete into the panels in a vertical position with the concrete portion of the panel being constructed with concrete formwork.

In conditions where the EMP protective panel system is required to take increased loading or to protect against the possibility of negative kinetic impact forces, the system may be designed to use post-tensioning cables and/or sheet piling or combination sheet piling and beam, h-pile or pipe configuration products/steel-sheet-piling for a greater section modulus https://en.wikipedia.org/wiki/Section modulus for the enclosure panels.

With the fast pace of EMP weapons technology innovations and advancement, similar to Raytheon's CHAMP weapon system, it is anticipated that these advancements will occur not only for EMP weapons but also for Intentional Electromagnetic Interference (IEMI) weapons, which these enclosure panels can also protect against if considered during the design process. Another aspect of the invention included in this application, is the end user may want a multi-layered approach which will provide even greater protection from man-made IEMI and EMP events as they currently exist, or the ability to withstand greater negative forces as weapon systems advancements are introduced.

Figure 6:
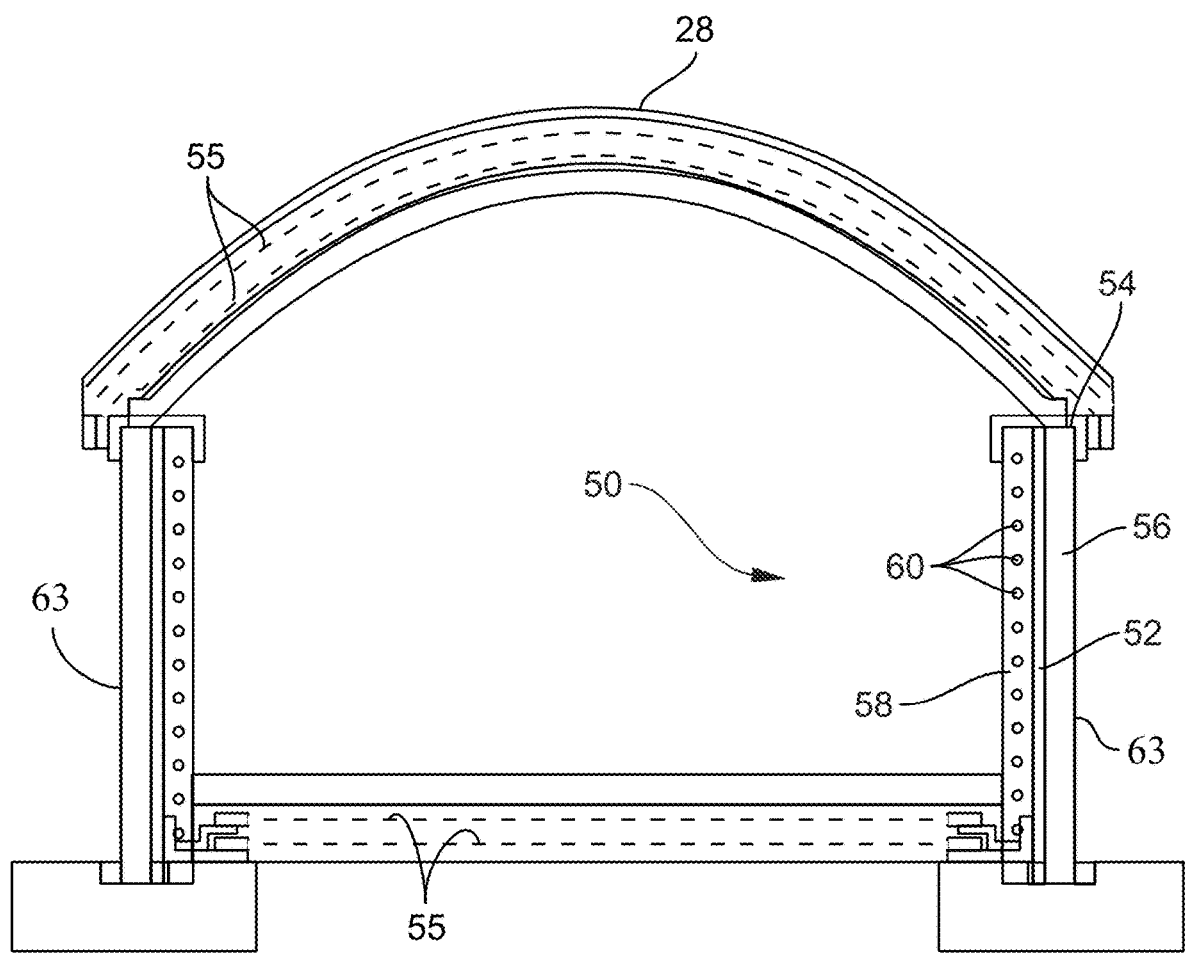
FIG. 6 is a partial side elevation of an EMP protected building utilizing an enclosure panel according to an embodiment of the invention.

Referring to FIG. 6, shown is a section cut of an enclosure panel 50 according to another embodiment of the invention. The casting bed 52 can be a sheet of steel that will form an integral part of a composite wall panel system formed of a number of enclosure panels 50 formed of walls 63. Primary steel members 54, preferably C-channels, are attached to the perimeter of the steel sheet 52 as shown. The primary C-channel members 54 along with the steel sheet casting bed 52 are used to permanently attach the enclosure panels 50 together once the walls 63 fabricated from the panels 50 are tilted up to their final location. The primary C-channel members 54 of the enclosure panels 50 have the added benefit that the primary C-channel members 54 can be used as the edge form for the concrete which will be poured into the enclosure panel 50. The panel 50 has both an exterior concrete layer 56 and a secondary interior concrete layer 58, which includes reinforcing bars 60. The concrete layer 58 can be installed by a poured-in-place method or a shotcrete applied means and method. The concrete used in the secondary layer 58 can have many different mix designs. For additional protection, an end user may want the secondary concrete layer 58 mainly for the protection of the integrity of the steel casting bed 52 from unintentional or intentional damaging acts. The primary intended use of this secondary concrete layer 58 can also provide a conductive and absorptive concrete mix design so in the unlikely event that any negative electromagnetic energy enters the EMP protected area of the structure, this secondary concrete layer 58 would add one more layer of protection which would minimize the negative destructive impacts of the EMP energy.

Figure 7:
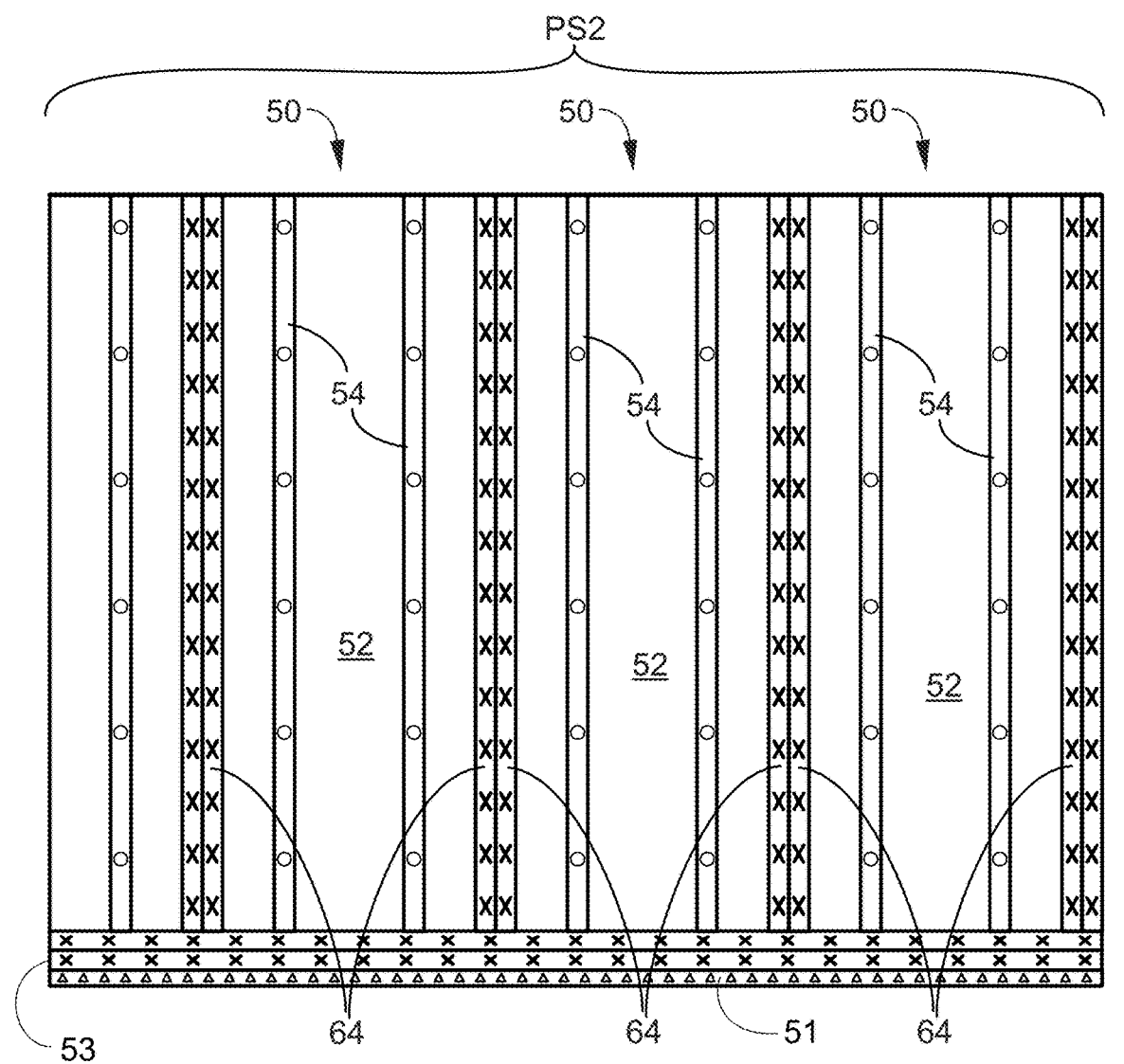
FIG. 7 is an elevation view of a series of connected enclosure panels according to an embodiment of the invention.

FIG. 7 shows the elevation view of the EMP protective composite wall panel system PS2 formed of a series of panels 50 that are erected and connected side-by-side in a manner the same as or similar to the connection method shown in FIG. 4, utilizing flat bars of steel 64 continuously welded to each panel 50 to create a solid metal connection which will allow for magnetic and electric field conductivity, shielding and absorption. The panel 50 is supported by a concrete foundation system 51 and a metal connection point 53.

Figure 8:
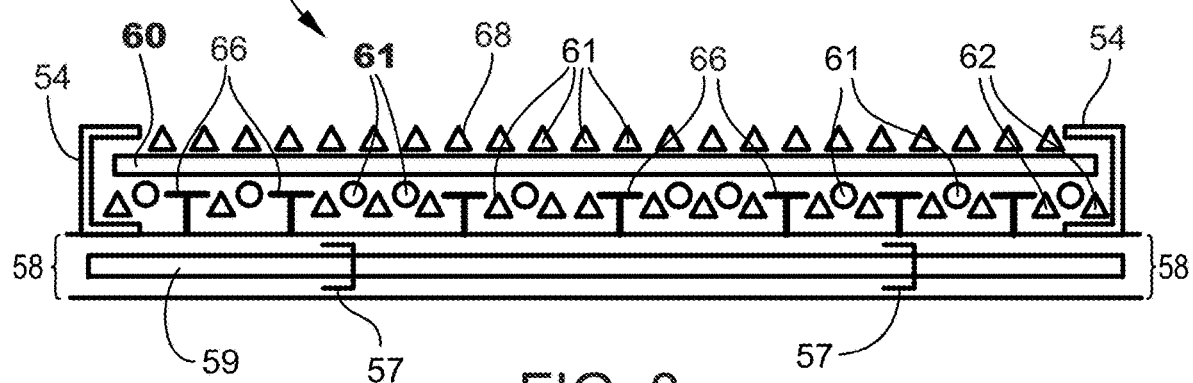
FIG. 8 is a cross-section of an alternative enclosure panel.

Referring to FIG. 8, the primary C-Channel members 54 of the panel 50 are provided with holes, not shown, through which to place steel reinforcing bars 60 to hold the concrete layer 62 in place. The panels 50 are tilted into place by lifting inserts 61.

Figure 9:
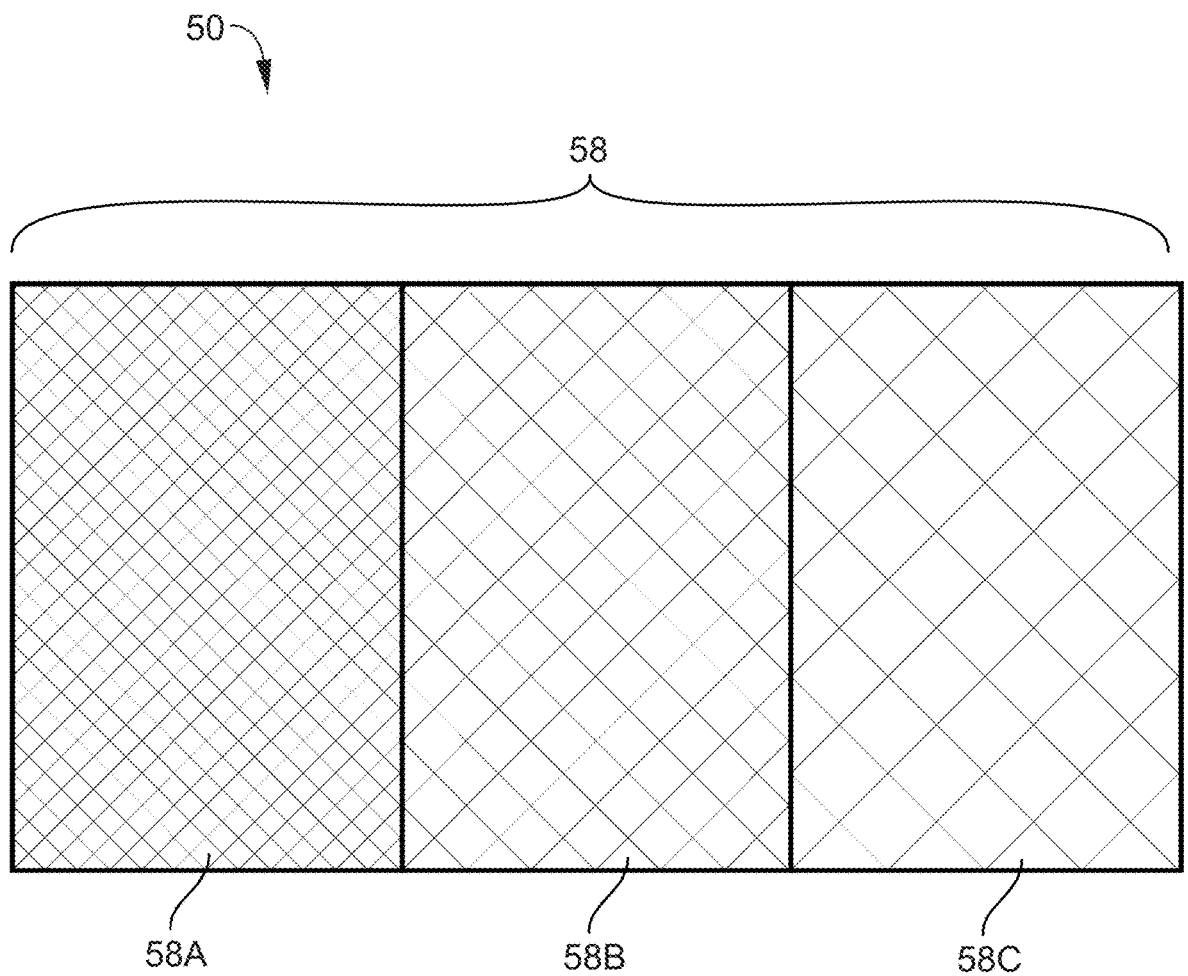
FIG. 9 is a fragmentary cross-section showing an interior concrete layer built up in separately-applied thicknesses.

To reduce the lateral pressure on the concrete formwork during the construction process, a secondary concrete layer 58 may be poured in multiple vertical lifts 58A, 58B and 58C, as shown in FIG. 9. The secondary concrete layer 58 encases secondary C-channel steel members 57 and steel reinforcing bars 59. If the shotcrete method is used for the secondary concrete layer 58, the shotcrete can be adhered to the metal sheet component using a chemical bonding agent and/or nelson studs 66 attached to the steel sheet 52 or reinforcing bars 60 as shown for the poured-in-place concrete method. See FIG. 8. In addition to specialized known concrete mix designs which can be used in the secondary concrete layer 58, Unistrut embeds or other types of concrete embeds used to increase the usefulness of the secondary pour can be incorporated into the design features.

Figure 10:
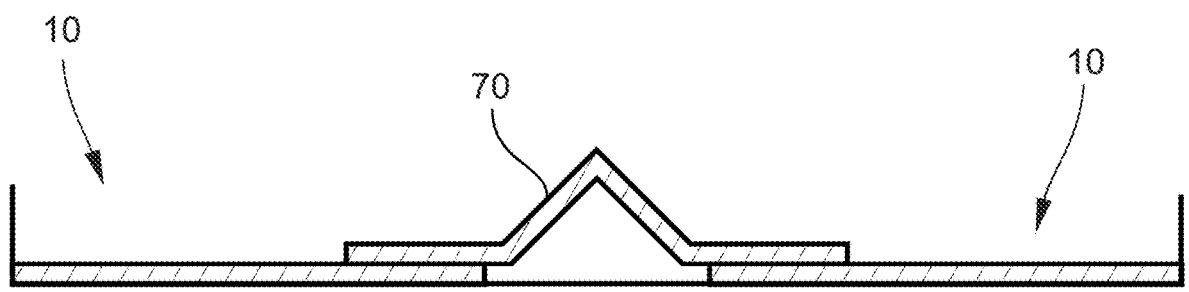
FIG. 10 is a cross-section of an expansion joint construction used to connect adjacent enclosure panels.

There are many different design features which can be used when the panels, for example, panels 10 and 50, are used for walls, floor or roof components in a structure. FIG. 10 shows the use of an expansion joint connected by welding into a wall formed of panels 10. The expansion joint 70 allows for movement of the structure due to expansion and contraction, but at the same time provides for the EMP and IEMI protective features to stay intact. The expansion joint 70 extends along the vertical length of the wall system PS2 and spaces the adjacent panels 50 apart. The expansion joints are connected by continuous welds. The outwardly-projecting face of the expansion joint permits movement of adjacent panels 50 relative to each other. This movement is converted into a corresponding flexure of the expansion joint in an outward and inward movement.

Another design feature which can be used in the panels 10 and 50 is an insulated panel incorporated into the construction of a concrete tilt-up insulated panel system in a conventional process. The insulated panel can be included in the structural portion of the panel or it can be included in the secondary concrete layer of the panel 10 or 50.

Lightweight concrete, epoxy concrete, Lafarge Holcim's ultra-high performance concrete DUCTAL, or autoclave concrete can also be a design feature in the panels. Other secondary type EMP protective methods that can be used in conjunction with the panels in which all methods can have absorptive carbon-based materials and conductive based steel fibers include a masonry CMU Wythe or veneer, sprayed urethane or other polymers, stacked backer board and/or precast panels.

Figure 11:
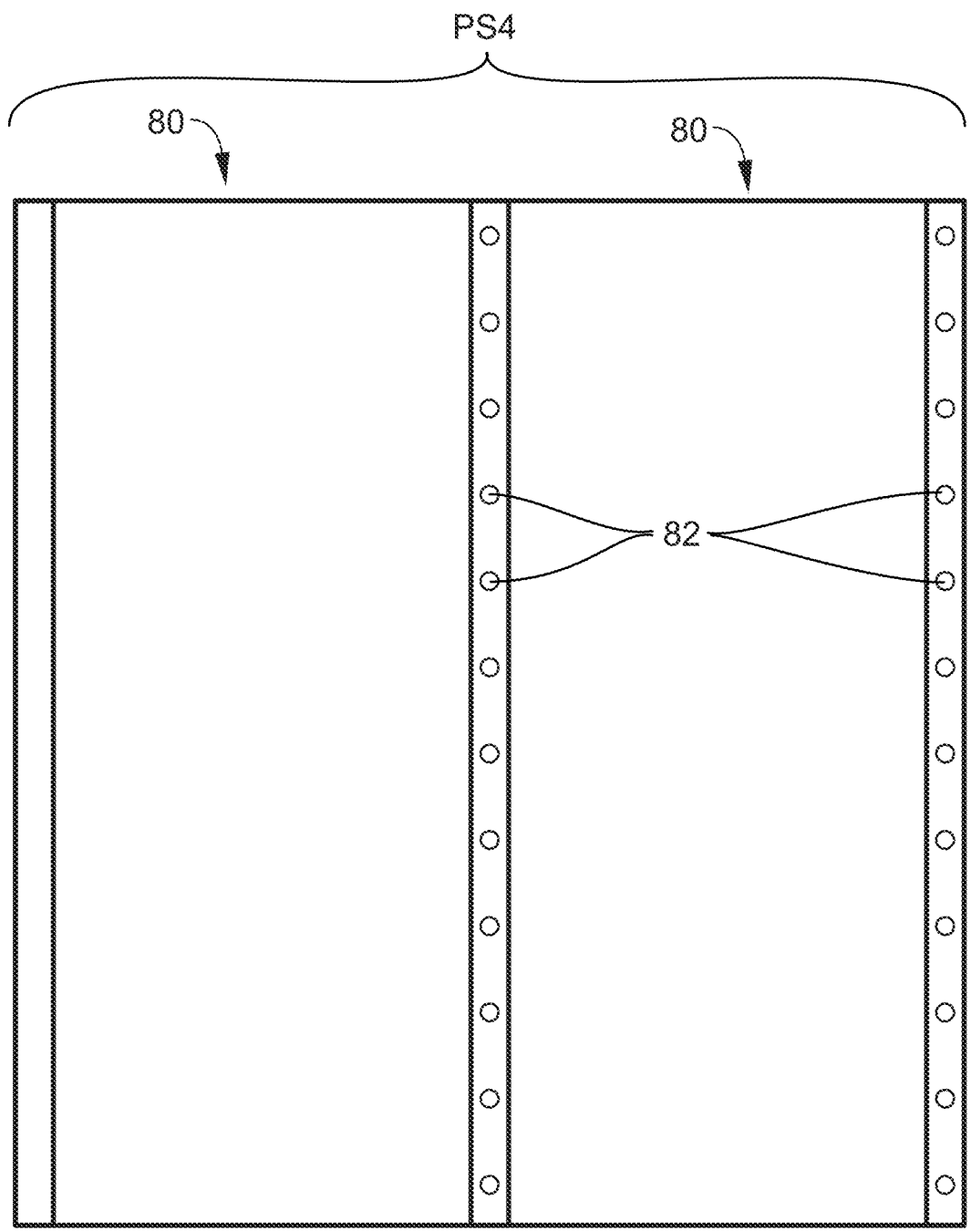
FIG. 11 is an elevation of a panel system created by connecting together adjacent enclosure panels according to an embodiment of the invention.

According to another aspect of the EMP protective composite enclosure panel system can be used in a horizontal position for roofs, below grade protection, ground floor level on grade or for elevated floors for multi-story structures. As shown in FIG. 11, the panels 80 form an EMP barrier system PS4 and are being used for the vertical walls, the below grade EMP protection barrier, and the roof 28 level EMP protection barrier. The walls, roof 28 level and the below grade level will be welded in continuous fashion (WO) to the vertical wall panels at all four sides of the structure to create a six-sided EMP protection barrier system. The panels 80 will be welded in a continuous fashion for both the roof 28 and below grade systems as described above for vertical walls panels. As with the vertical enclosure panel system PS2, the horizontal panels can have the concrete either facing up or down and can include secondary pours and EMP protective and specialty concrete mix designs as required. The roof 28 panels can be designed to carry their own load if required, especially for smaller structures as described below, but it is envisioned on large structures that the panels will be supported by traditional known construction methods for building of structures including but not limited to steel construction, poured-in-place concrete construction, precast concrete construction, and box culvert tunnel forms. Poured-in-place or precast members can be inverted T sections that have a place for the panels to structurally transfer the dead and live loads and be easily welded in a continuous fashion.

According to another aspect of the invention, the panels can be designed and fabricated in a non-load bearing version reduced in thickness and weight as compared to the structural enclosure panels described above. The need for a lighter version of the panels can be applied when an existing building which is not protected from EMP events but is required to be retrofitted to provide for this protection. Such a building can be retrofitted to include EMP and/or IEMI protection if the structural analysis of the existing building concludes that the existing structure can withstand the additional weight of the panels. Although the ETS-Lindgren shielding system, the Braden shielding system and the Universal shielding system are composite panels they are made of different materials than the panels described in this application, all three of those systems are much lighter in nature and are less robust. These three systems traditionally use shielding systems constructed of light-gauge metal with wood members and light-gauge metal composite panels, which are commonly mechanically fastened together with fasteners, versus the invention of this application which uses sheet steel (or mesh) and concrete, and uses different connection techniques and methods of structurally strong components for long-term secure EMP protection integrity of the system. With the advancements in Ultra high-performance concrete made in the past decade, the panels can be designed to be ultra-high strength with a fraction of the weight of the concrete used in the past, making them advantageous for military shipments and/or interior upgrades for EMP protection when the existing building structure can support the additional weight of the panels.

As stated above, MIL-HDBK-1195 cautions against the use of mechanically fastened panel shielding systems for maintainability and durability reasons. This is understood to be directed to existing shielding systems that are constructed using light-gauge metal in the composite panels. In addition to being able to weld the enclosure panels, in certain applications the panels can be best rapidly constructed and utilized when connected using structural bolts, nuts and washers. With these types of mechanical fasteners the joints will pass MIL-STD testing requirements for EMP protection. This will not only allow design flexibility, but it will allow for a multi-sided structure with the walls, floor and a roof 28 that can be efficiently transported to remote locations and assembled without welders.

This ability can be particularly useful for the assembling of a panel system for military operations' command, control, communications and computers (C4) structures. The protection enclosure panels can be erected and assembled inside an existing structure or they can be weatherproof and be erected outdoors and designed and installed to provide protection from weather.

Figure 12:
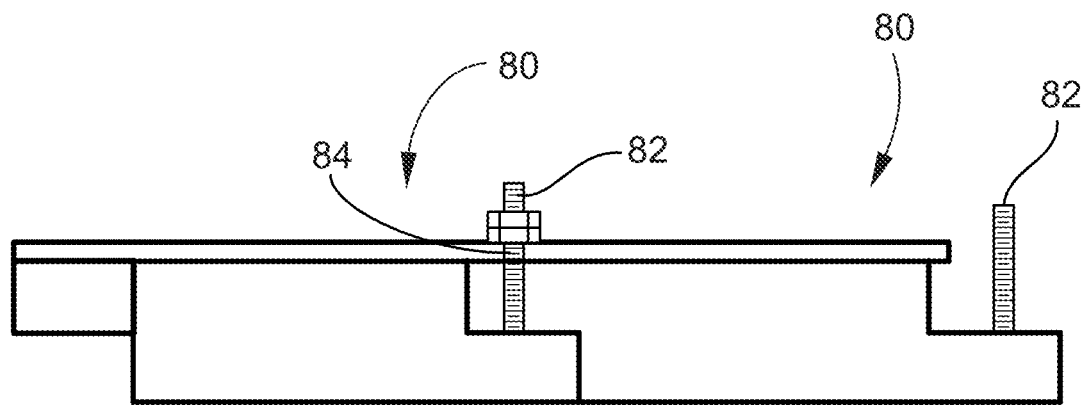
FIG. 12 is a partial cross-section showing a lap-joint feature for connecting adjacent enclosure panels.
Figure 13:
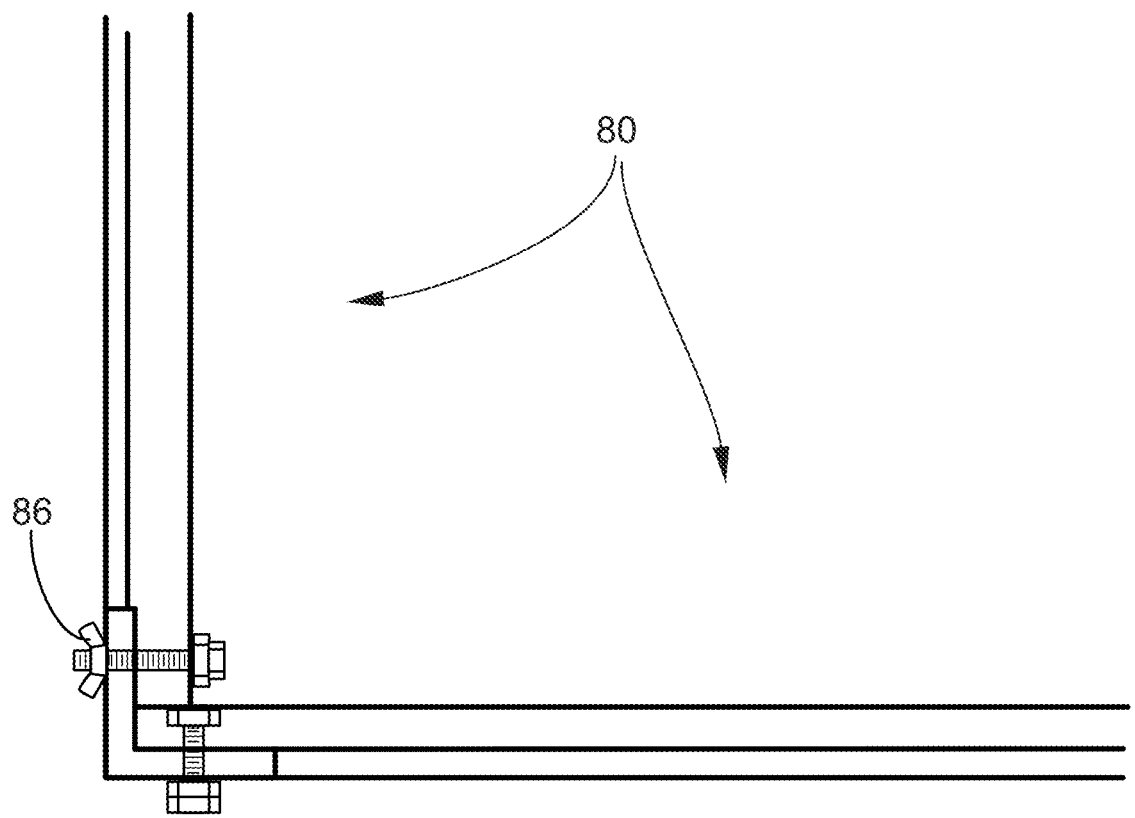
FIG. 13 is a partial elevation showing one means of assembling enclosure panels.

As shown in FIG. 12, panels 80 that are fastened with structural nuts, bolts and washers can have overlapped steel on the one end of the panel which overlaps the connecting abutting panel as shown. One panel 80 can be designed and constructed to have protruding bolts 82 extending out of the panel 80. The protruding bolts 82 are attached to the panels 80 and the panel 80 can also contain a depression feature, for example a lap joint, the same thickness of the steel sheet of the connecting panel 80 and the connecting panel 80 is provided with pre-drilled aligned holes 84 through which the protruding bolts 82 are extended and fastened with washers and nuts.

This same type of connection can be used for the roof panels' connection to the wall panels. On the interior intersection points of the roof 28, floor and walls, an interior angle can be used in addition to or in lieu of the exterior angle for mechanical fasteners. Interior angles and their panel can have steel inserts in the panel to receive bolts to hold the angle in place. Inside the angles for mechanical fasteners metal braided shielding material can be added for additional confidence that all panels will be securely connected electrically for total EMP protection. For installations that are rapidly deployed and assembled, conductive tape and metal wools can also be placed over the joints before or after the mechanical fasteners are installed for additional EMP protection. If welders are available, these lighter version panels can also be welded together. Joints can also be filled with grout or caulk which contains EMP protection features of steel fibers and carbon containing materials.

The ground level panels for exterior military styled uses can have many different tie-down features on the outside of the enclosure or the inside of the enclosure which will allow for the capability to securely tie down the panels to withstand wind, seismic forces or other destructive forces.

Another design option is for the panels which provide a concrete face on both sides of the panel with the metal sheet to be constructed to provide EMP protection as constructed between the separate concrete portions of the panel.

Panels in accordance with the invention can also be constructed with steel sheet on both sides and concrete placed in the middle. Different types of concrete and different sizes and types of steel can be used in addition to connecting the panels by welding and/or mechanical fasteners.

According to another aspect of this invention, satisfactory EMP results are achieved by providing the panels with either a single or multiple layer of mesh in lieu of a steel sheet. This manufacturing method can be utilized for structural panels or lighter non-load bearing panels. One envisioned application using this method is when EMP and IEMI protection is done on the interior of an existing structure. Using mesh can make the panels lighter in weight which will allow existing structures that have marginal additional load carrying capabilities to be retrofitted to provide the end users' desired EMP and IEMI protection system. Also as stated above, C4 structures for interior or exterior applications will be well suited for this formulation. With mesh and ultra-high-performance concrete used together, the panels can be used in many applications where a light frame is desirable. The term mesh used in this application is meant to include any conductive metal with openings sized small enough to conduct or deflect electromagnetic energy. Many different types of materials including but not limited to woven wire fabric, metal cloth and/or perforated metal can be used in these mesh applications. Welded wire fabric that is used as a structural reinforcement for concrete is not used for EMP protection features.

Another aspect of this invention is that the shapes of the panels do not have to be limited to square or rectangular shapes, nor do the panels have to have the same dimensions throughout the area of the panel. The enclosure system according to the invention may be a structural load-bearing arch which can be above or below ground that may or may not be covered with earthen materials, coke breeze and/or coal combustion residuals. An elliptical shape may be manufactured for vertical walls for building sites located where tidal surges or high waves can be produced by hurricanes or other extreme events. Circular-shaped buildings with flat or domed roofs can be used in areas that are prone to extreme weather conditions such as tornados.

The panels disclosed in this application have inherent features that allow for easy and secure installation of EMP protective doors and waveguide penetrations to be incorporated into the panels. A waveguide is essentially a hollow conducting tube which acts as a filter for Electromagnetic Interference (EMI), but which allows air or fluids to pass. Only EMI energy at very high frequencies can pass through it with little attenuation. All penetrations into and out of an EMP or IEMI protected building structure including, but not limited to air, water, fluids, gas, sewer, electrical, mechanical, internet and communications, and ingress and egress locations must have design features that will stop EMP energy from entering the EMP and IEMI protected space. Waveguides can also be incorporated in the panels to allow for sunlight, which has been stripped of negative EMP energy, to safely enter the building structure. Waveguides have been developed over a period of eighty years but have been used in mostly the same fashion since then.

Another useful system that has been publicly known for centuries is the labyrinth. Modern day labyrinths for physical protection are known in military applications.

An academic paper titled "Development of a Doorless Access Corridor for Shielded Facilities" authored by A. J. Mauriello a senior member of IEEE, and another academic paper titled "On The Design of Door-Less Access Passages to Shielded Enclosures" authored by Vince Rodriguez of NSI-MI Technologies contain information on the use of Labyrinths in EMP protected structures.

In addition to what is stated above in this application, it is clear that end users are looking for a method to get large volumes of air into and out of structures in a short period of time to allow for the operation of combustion turbines and/or reciprocating engines to produce electrical energy inside an EMP protected structure.

Figure 14:
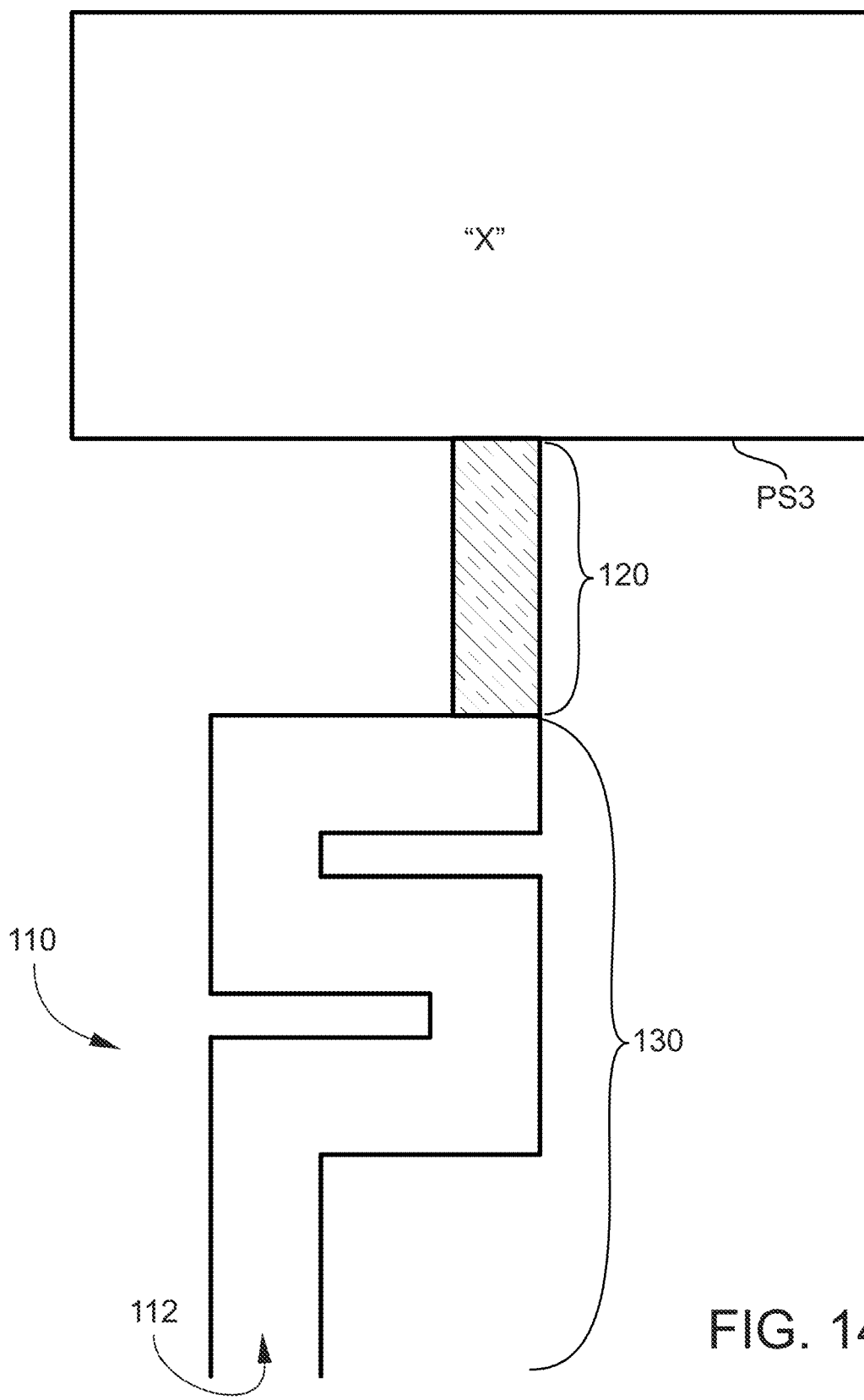
FIG. 14 is a schematic plan view of an EMP-protected building that a multi-frequency EMP attenuation labyrinth that includes multiple areas having different levels of EMP attenuation.

With reference to FIG. 14, one innovative feature of this application is that the entryway is broken into two sections, a low frequency section and a high frequency section. The Low Frequency Section is created by forming a steel plate on the interior of the enclosure panel or welded mesh waveguide below cutoff.

The High Frequency Section is created by casting or pre-casting conventional concrete (with non-conductive rebar) or by using carbon concrete with conventional steel reinforcement. The High Frequency Section will be created by forming some number of turns in the entryway. Any HEMP or RF energy that enters into the entryway will be forced to reflect on (and be partially absorbed by) carbon absorber in the concrete or the carbon that completely encloses the high-frequency section each time the energy hits a 90 degree or 180 degree turn in the entryway. This carbon may be coke breeze, pet coke, carbon-based concrete or CCR.

HEMP energy that hits the EMP protected facility will have high and low frequency components. The carbon-based material will absorb the high frequency components (for discussion say this is 30 MHz and above). Energy below 30 MHz (low frequency) will pass through the carbon-based materials and will not be blocked by the high frequency section. However, the steel or mesh in the low frequency section of the labyrinth will form a "waveguide below cutoff" and shield the EMP protected area from the low frequency EMP energy.

The low frequency energy will not be able to propagate through the steel or mesh waveguide of the low frequency section of entryway because of well-established waveguide below cutoff electromagnetic principles. Therefore, the interior, protected section of the EMP protected facility will be completely shielded from harmful electromagnetic effects of the HEMP pulse.

For security purposes, these labyrinths when used for airways can be turned 90 degrees from when they are used for personnel passageways. Other methods including but not limited to, circular, spiral, vortex combinations, and sloped labyrinths, can be used that have the distinct low and high frequency sections with the panels of different materials facing in the described directions.

By continued reference to FIG. 14, a hypothetical EMP protected space "X" is EMP protected using a panel system such as PC3, described above. Access to the protected space "X" is through a labyrinth 110 that includes the placement of low frequency attenuation panels 120 abutting and connecting to the EMP protected structure "X" and higher frequency attenuation frequency protective panels 130 are located near where the ingress/egress access 112 is located. The connection method for the 90-degree intersections and straight connecting points are as outlined above in this application.

The low frequency protective panels 120 will have the steel side facing to the interior of the labyrinth 110. The high frequency attenuation section will have carbon-based concrete with conventional steel reinforcement facing the interior of the labyrinth 110. Another option for this high frequency section is to use conventional concrete with non-conductive reinforcing bar. Ultra-High-Performance concrete without any rebar may also be used in these high frequency EMI panels 130. Having the panels 120 and 130 positioned as in this layout will allow for greater attenuation efficiencies which can decrease the overall required length and size dimensions of the labyrinth 110, therefore reducing the construction cost. The roof and floor panels of the panels can be placed in the same fashion for each low and high frequency sections. When cost or decreased size is not the design criteria's main objective, the increased spacing between the panels 120 and 130 in the labyrinth will allow for the heights and widths of the labyrinth 110 to be increased due to the enhanced EMP protective capabilities of the formulation and application of this invention.

Figure 15:
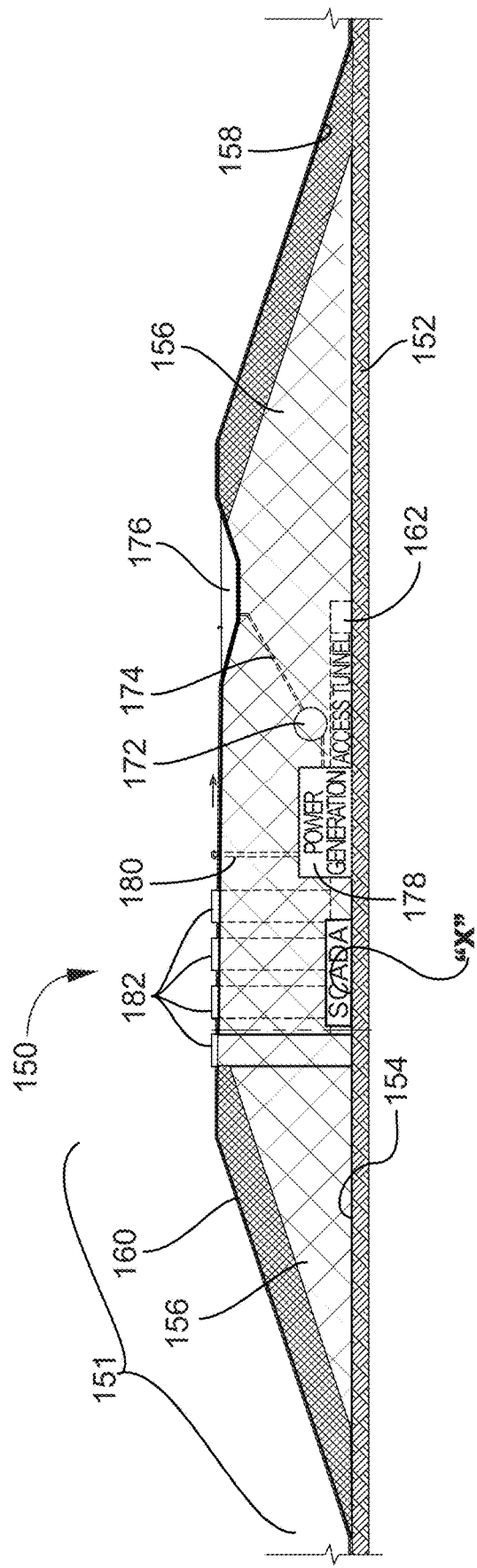
FIG. 15 is a schematic vertical cross-section of a building constructed using an EMP protective composite enclosure panel system including coal combustion residuals.
Figure 16:
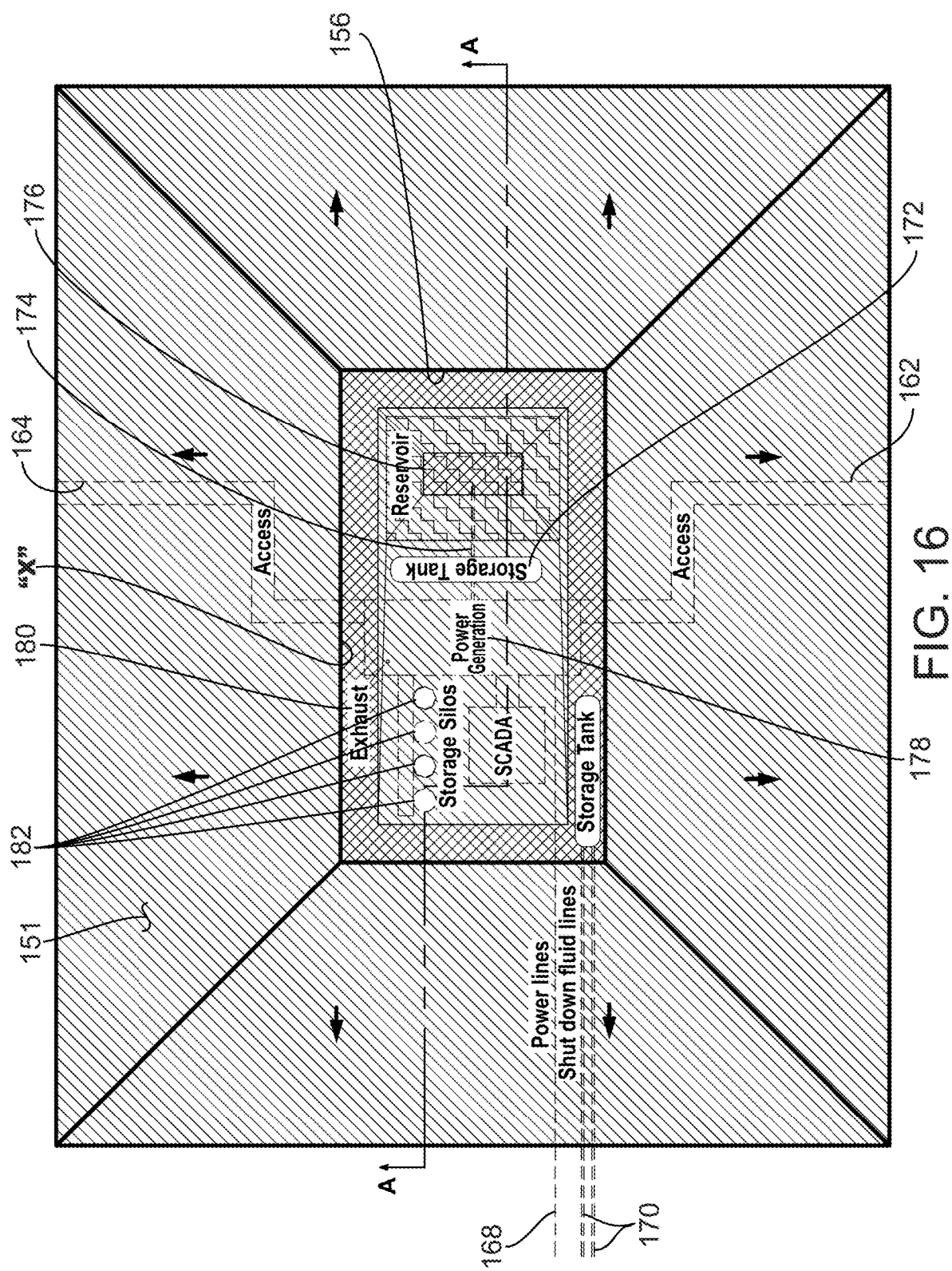
FIG. 16 is a schematic plan view of the building shown in FIG. 15.

Referring to FIGS. 15 and 16, an EMP-protected building according to one embodiment of the invention is shown at reference numeral 150. This building 150 may be any desired size, including for example, 13.5 million cubic yards. The building 150 rests on a conventional building prepared subgrade 152 covered with a liner system covering 154 that prevents any runoff from the building 150 from entering the ground through the foundation 152. The principal component of the volume of the building 150 is densely-compressed CCR 156 that is encapsulated under a reinforced CCR cap 158. A liner system covering 160 encloses the CCR 156 and CCR cap 158. All or part of the structure 150 may be covered with soil and vegetation. As shown in FIG. 15, the building 150 has severely-sloped sidewalls 151 designed to deflect a blast proximate the building 150.

Continued reference to FIGS. 15 and 16 indicate labyrinth-type ingress/egress access tunnels 162, 164 that connect the exterior of the building 150 with the interior "X" of the building 150. As best shown in FIG. 16, the interior "X" of the building 150 includes necessities for sustaining life for an extended time, including lines 168 delivering electric power to the building 150, fluid lines 170 for delivering and conveying away water, sewage and the like, a water storage tank 172 that can be gravity fed when necessary through a feed line 174 from a reservoir 176. Electric power can be generated by a generator 178 when current from exterior the building 150 is not available. Combustion gases from the generator 178 and ventilation of other gases is by an exhaust stack 180. Storage silos 182 provide storage for food, water and any other materials that are required.

Figure 17:
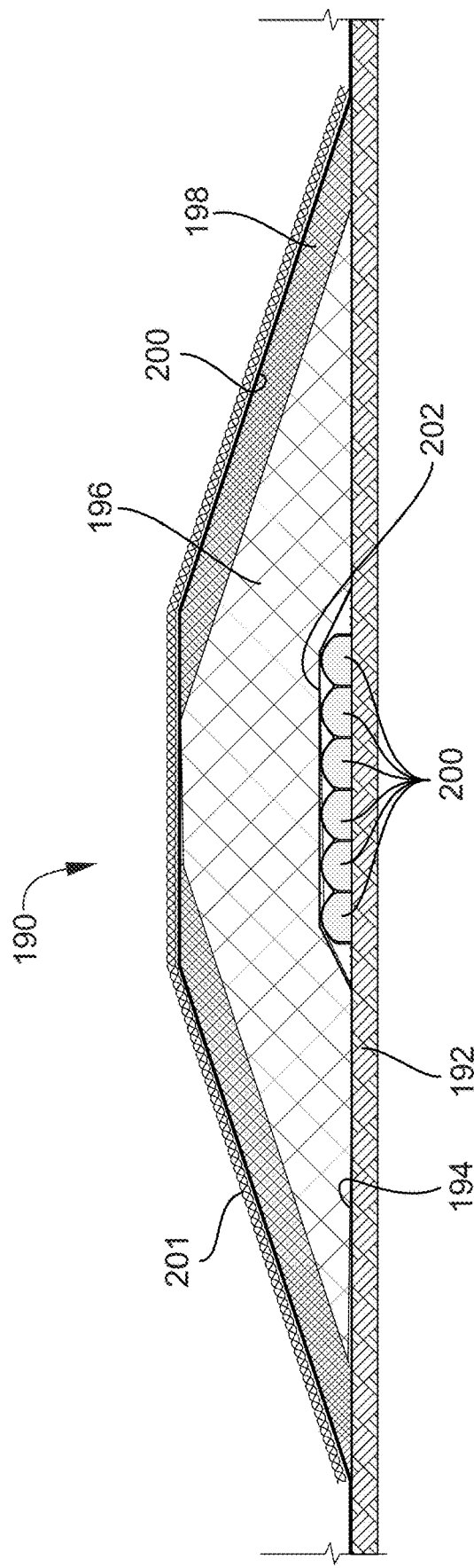
FIG. 17 is a schematic vertical cross-section of a building constructed using an EMP protective composite enclosure panel system including coal combustion residuals according to an alternative embodiment of the invention.

Referring now to FIG. 17 a building 190 is shown and may be any desired size, including for example, 13.5 million cubic yards. The building 190 rests on a conventional building prepared subgrade 192 covered with a liner system 194 that prevents any runoff from the building 190 from entering the ground through the foundation 192. The principal component of the volume of the building 190 is densely-compressed CCR 196 that is encapsulated under a reinforced CCR cap 198. A liner system covering 200 encloses the CCR 196 and CCR cap 198. All or part of the structure 190 may be covered with soil and vegetation 201. As shown in FIG. 17, the building 190 has severely-sloped sidewalls designed to deflect a blast proximate the building 190. The building 190 is adapted to store, for example, bulk storage items in separate reinforced rooms 200 protected by a further reinforced enclosure 202. Rooms 200 and the reinforced enclosure 202 are constructed according to the construction principles utilizing the composite enclosure panel system identified in this application to achieve an EMP-protected area within the building 190.

Figure 18:
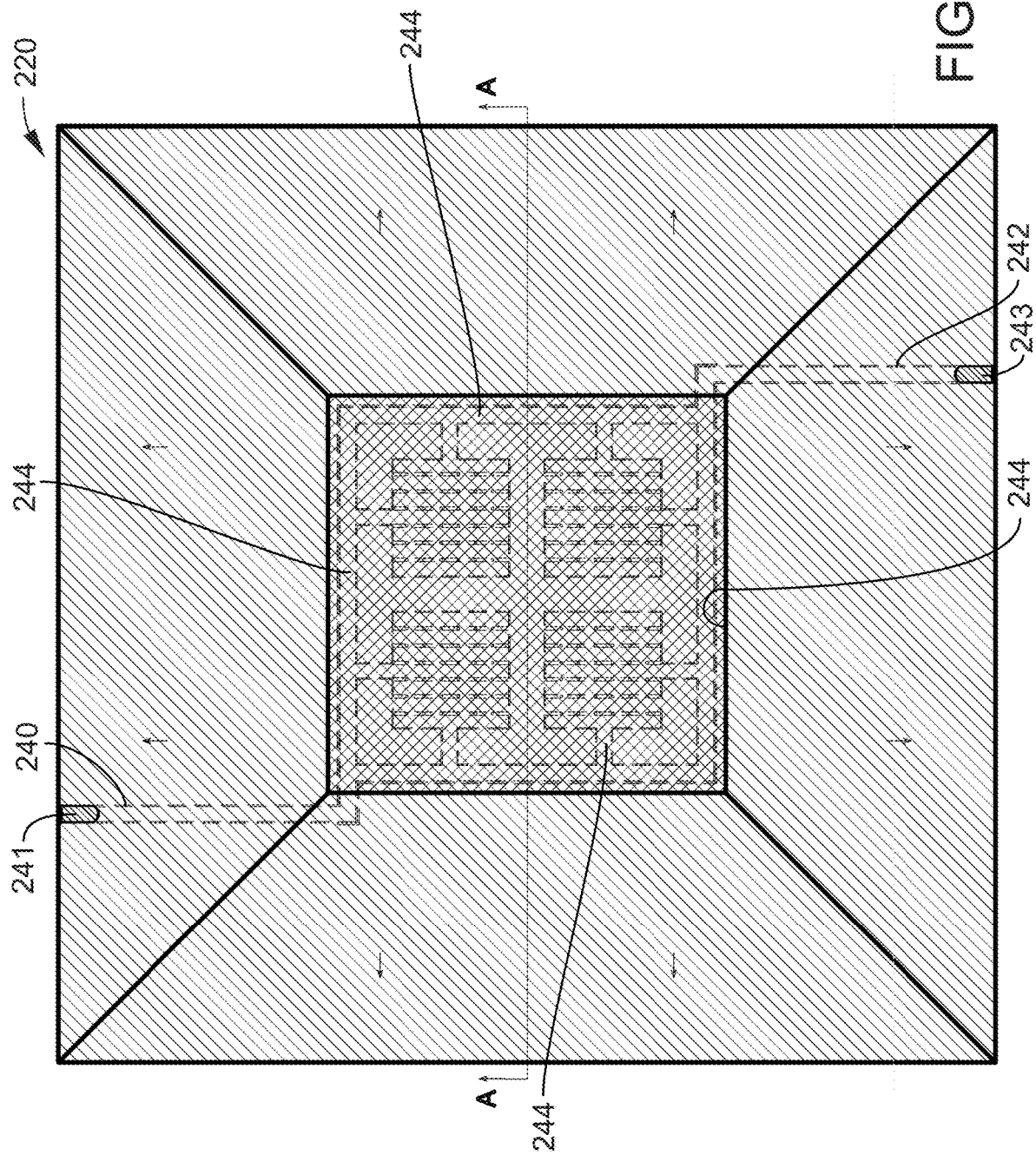
FIG. 18 is a schematic plan view of the building shown in FIG. 19 of a building constructed using an EMP protective composite enclosure panel system including coal combustion residuals according to an alternative embodiment of the invention.
Figure 19:
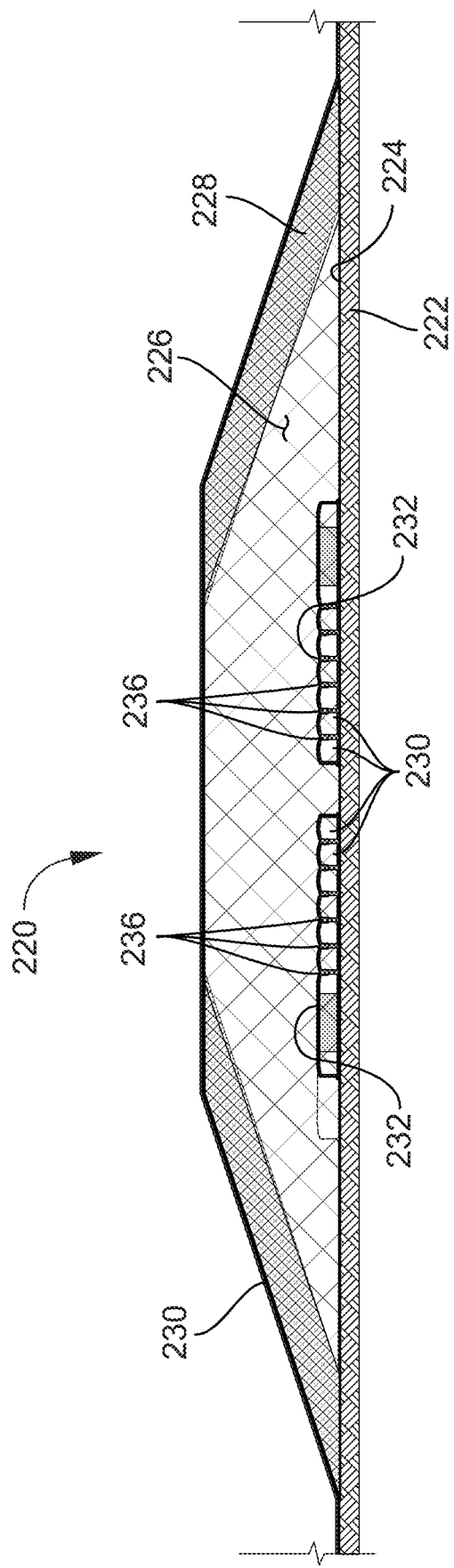
FIG. 19 is a schematic vertical cross-section of a building constructed using an EMP protective composite enclosure panel system including coal combustion residuals according to an alternative embodiment of the invention; shown in FIG. 18.
Figure 20:
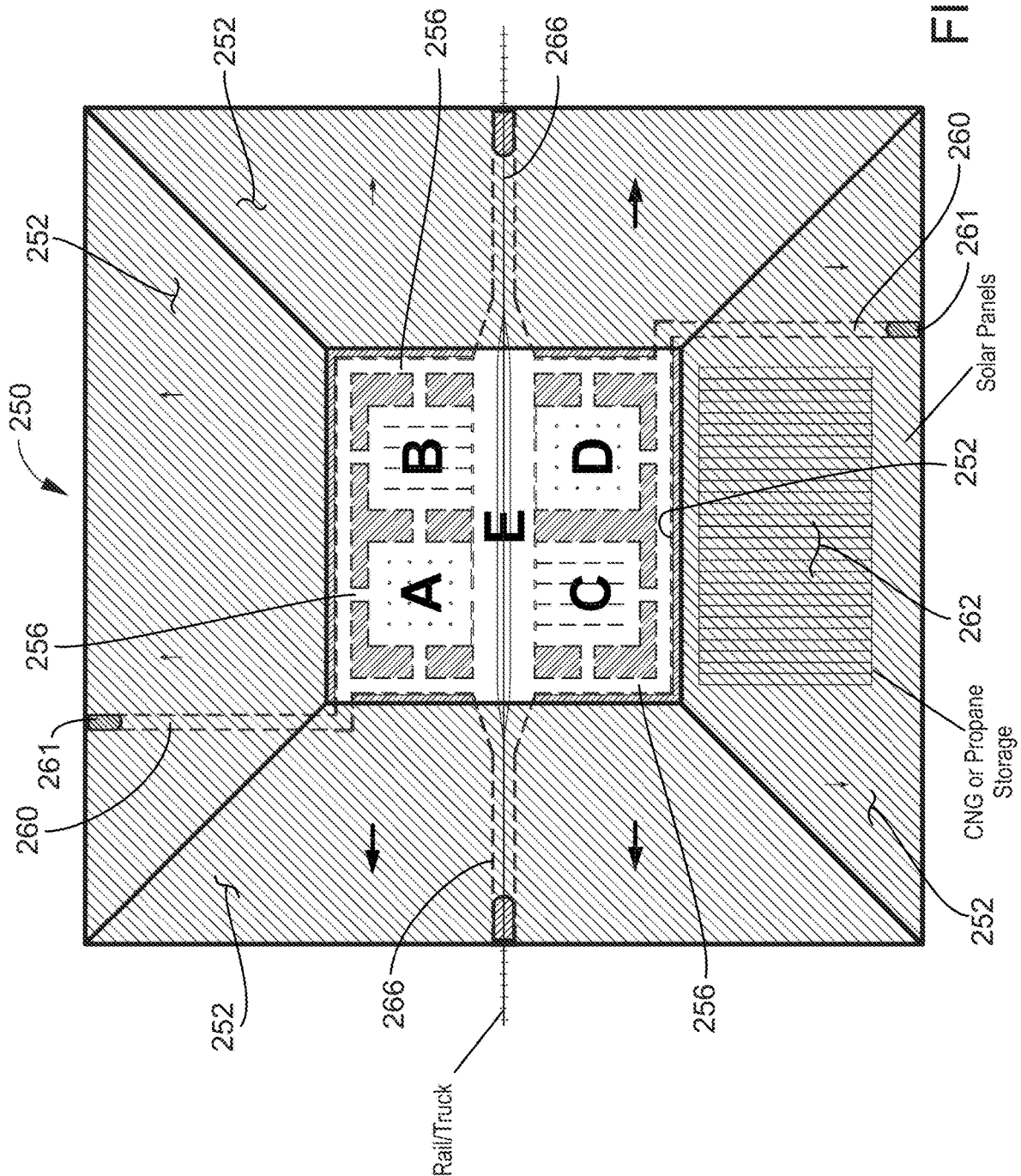
FIG. 20 is a schematic plan view of an EMP protective composite enclosure panel system including coal combustion residuals according to an alternative embodiment of the invention.

Referring to FIGS. 18 and 19, an EMP-protected building according to one embodiment of the invention is shown at reference numeral 220. This building 220 may be any desired size, including for example, 13.5 million cubic yards. The building 220 rests on a conventional prepared subgrade 222 covered with a liner system covering 224 that prevents any runoff from the building 220 from entering the ground through the foundation 222. A liner system covering 230 encloses the CCR 226 and CCR cap 228. All or part of the structure 220 may be covered with soil and vegetation. As shown in FIG. 20, the building 220 has severely-sloped sidewalls designed to deflect a blast proximate the building 220.

The building 220 is adapted to provide a predetermined number of rooms 230 protected by further enclosures 232 of reinforced concrete. The enclosures 232 also include internal concrete columns 236 separating the rooms 230 from each other. Rooms 230 and reinforced enclosures 232 are constructed according to the construction principles utilizing the composite enclosure panel system identified in this application to achieve an EMP-protected area within the building 220.

Continued reference to FIG. 18 indicates labyrinth-type ingress/egress access tunnels 240, 242 closed by HEMP doors 241, 243 that connect the exterior of the building 220 with the interior of the building 220 where the rooms 230 are located. As best shown in FIG. 19, the rooms 230 are connected by passageways 244 that connect with the access tunnels 240, 242.

Referring to FIG. 20, a further detailed explanation of the interior of a building constructed in accordance with the principles of this application is shown with reference to a building 250. The exterior of the building 250 is as described above with reference to FIG. 20, except that instead of vegetation, the exterior walls of the building 250 are covered with solar panels 252 and the building 250 under normal operating circumstances is self-sustaining with regard to electric power generation and use.

By way of example, the interior 254 of the building 250 is divided into five zones, identified as zones A-E. Zones A-E are interconnected by passageways 256 that communicate with the exterior of the building 250 through labyrinth-type ingress/egress access tunnels 260, 266 closed by HEMP doors 261.

Zone A is occupied by an operations center and living quarters, and concludes, communications, a data center, living quarters, a mess hall and kitchen facilities, restroom and shower facilities and a laundry.

Zone B contains storage for food, water, medical supplies and equipment, apparel and hygiene-related supplies and equipment.

Zone C contains generators, battery storage, transformers, power substation, power plant SCADA system; and a supply of fuel for fuel-consuming apparatus. Fuel storage, for example, diesel, propane, LNG and the like is maintained in a separate storage area 262.

Zone D contains storage for spare and replacement parts for all operating equipment, SCADA, utility trucks and equipment.

Zone E is accessed by ingress/egress access routes 266 and enables transport into and out of the building 150 by rail, tractor/trailers, for lifts and the like.

Figure 21:
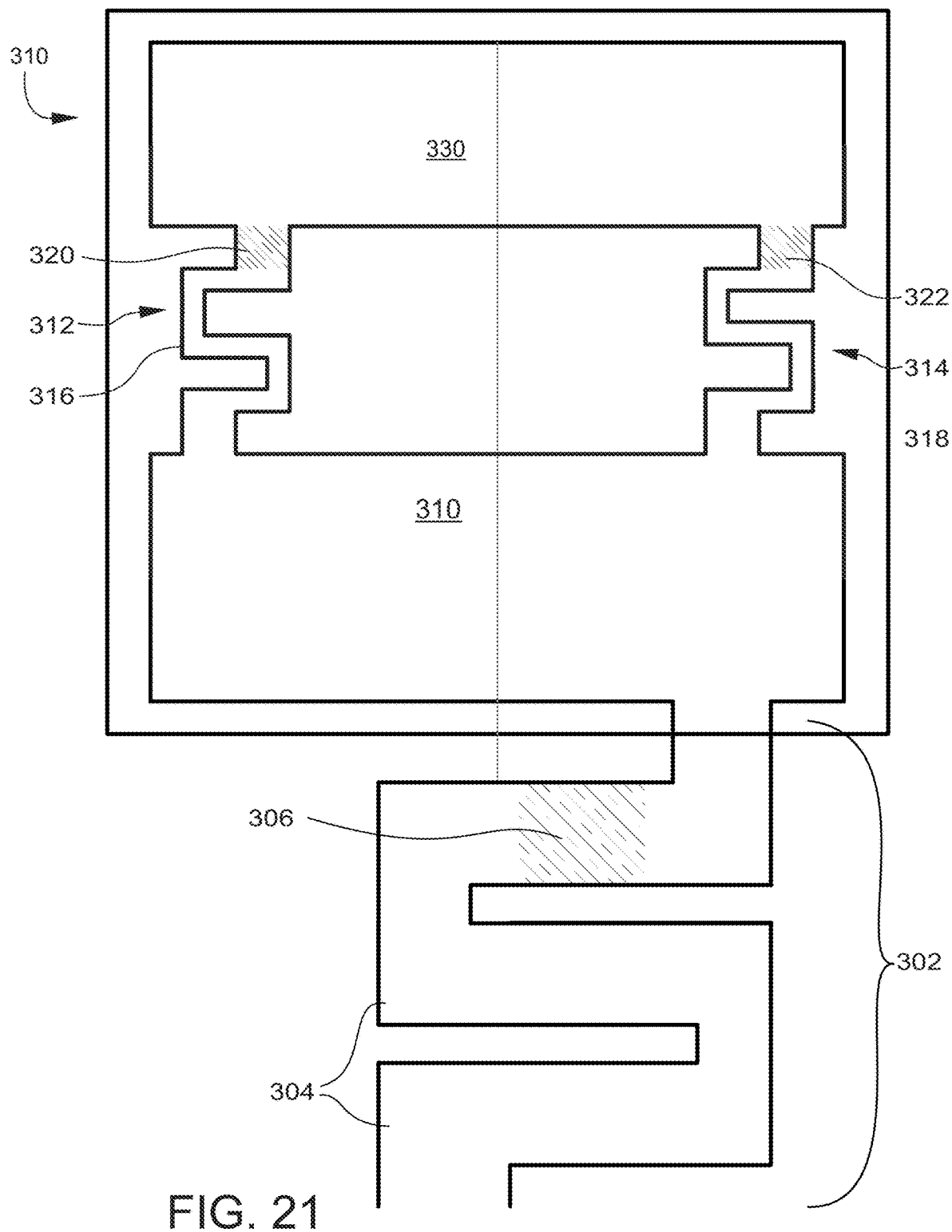
FIG. 21 is a schematic plan view of an EMP-protected building that a multi-frequency EMP attenuation labyrinth particularly adapted for use by trucks, railways and similar very large transport equipment.

Referring now to FIG. 21, as the dimensions of the labyrinths are increased past the size for personnel passageways and large volume airways to the size which will allow for trucks and equipment to pass. In FIG. 21 a protected structure 300, which may be any of the above-described structures, includes an additional but larger (in width, length and height) labyrinth 302 using the same EMP-PCEPC and similar layout configurations with a high frequency protection section 304 and different and distinct low frequency protection section 306, as described above. The dimensions are large enough for trucks and equipment to pass through, and will be used to absorb much, but not all of the E1, E2, and E3 EMP energy before this energy enters a loading dock area 310, as well as IEMI energy that originates outside the structure 300. The larger spacing increases the width and height of the enclosure panels 10 relative to each other, which decreases the effectiveness of the labyrinth's 302 protection capabilities. However, variations in the amount, type and placement of carbon absorber may present adequate high-frequency absorption effectiveness for these large entryway labyrinths 302, depending on specific dimensions and placement. In this application where a larger entryway is used, not all of the EMP protection necessary to meet the attenuation levels as required by the MIL-STD may be attainable, but when used in the formulation and application as shown on an additional waveguide and/or labyrinth-method to bring objects/material that is typical of loading dock operations into and out of large buildings will be achieved. The additional waveguide will prevent low-frequency EMP energy from entering the main facility. If necessary, an additional labyrinth structure may be placed to prevent any remaining high-frequency EMP energy from entering the structure so that the overall composite attenuation between the outside of the structure and the inside of the structure meets or exceeds MIL-STD attenuation requirements for EMP protection.

The truck/vehicle and equipment labyrinth will be used in conjunction with a loading dock 310 located inside the structure 300's perimeter that has one or more smaller labyrinths 312, 214 and/or waveguides into and out of EMP and/or IEMI partially protected loading dock areas. In using the enclosure panels 10 in this application, the smaller labyrinths 312, 314 can be used for personnel, forklifts, air casters, and/or other methods to bring materials, supplies and/or equipment using a doorless ingress/egress method to EMP and IEMI protected area of the building. These smaller labyrinths 312, 314 also include high frequency absorption areas 316, 318, respectively, and low frequency absorption areas 320, 322, respectively. These labyrinths 312, 214 allow access into an interior protected area, such as a human occupancy area 320.

The large truck and equipment labyrinths such as labyrinth 302 may have curved, spiral or switchback type features, these labyrinths may be underneath the CCR or coke breeze, or can be cast or fabricated carbon-containing concrete and be along the perimeter of two or more sides allowing for 90 degree turns if desired. On large structures, labyrinths can also vary many stories in height, up and down in elevation, with distinct sections for high and low frequency absorption and conductivity. This method can give EMP protective capabilities that when used in conjunction with the smaller labyrinths 312, 314 will meet the required MIL-STD. Sliding gates or swing gates which contain enclosure panels can be used at the 90 degree turns which can be used to decrease the overall dimension and still allow for large pieces of equipment and trucks to have a larger turning radius. Additional turns and zigzags can be installed so that if any one gate is in the open position during the movement of trucks or equipment, the level of attenuated EMP energy that can enter the partially attenuated interior loading dock area will not be above the design limits.

The Labyrinths may have EMP protected fiber optic lighting for illumination.

An air and/or personnel entryways into the CCR structure may be created through the use of an RF absorber in conjunction with a Waveguide Below Cutoff (WBC). The entryway will be comprised of an RF absorber, such as encapsulated CCR, coke breeze, MET coke, PET coke (containing varying percentages of carbon) or other carbon or non-carbon absorbing material with welded steel or welded steel mesh embedded in the RF absorber and configured to create a WBC. The entryway will function such that low frequency electromagnetic waves will be blocked by the WBC and higher frequency electromagnetic waves (above the cutoff frequency) will be absorbed by the RF absorber thereby creating a personnel or air entryway capable of blocking RF energy without utilizing an RF door. The entryway path may or may not curve or turn to help facilitate RF absorption. The entryway may include rudimentary RF shielding doors, turnstiles, or other RF absorbing features to improve overall RF shielding performance.

Another building system innovation that can be used in the protection against EMP is the use of coke breeze and other acceptable carbon containing materials and a single or multiple layer of mesh. When multiple layers of mesh are used, the space between the different layers of mesh should be 4 inches or greater to achieve the maximum effectiveness for EMP protection. Less spacing can be used, but it will decrease its effectiveness. The meshes are either placed above, below or in the coke breeze material which when used in conjunction with each other will provide protection from the E1, E2 and the E3 components of the EMP energy. Mesh can also be placed in concrete, earth, CCR and/or other material(s). When coke breeze is used in combination with the mesh in other locations in the structure it gives the required level of EMP protection. See FIG. 6.

A building section may use enclosure panels 10 in accordance with the invention for the walls, below the slab on grade, and for the roof 28 level. EMP protection is provided by using a layer of coke breeze and two layers of mesh. This is one example of how carbon containing materials and mesh can be used to provide EMP protection, but there are many different configurations where the formulation and application of using these two absorptive and conductive materials can be used together. The novelty of using coke breeze and/or other carbon materials together with a single or multiple layer of mesh allows for a cost effective EMP protection system which can be used in a vertical, horizontal and/or angled application. This invention is not only effective; it is also cost effective in many applications. The Mesh protects against the low frequency E1 component of an EMP and the coke breeze protects against the E2 high frequency portions, E3 and portions of the E1 component of an EMP. Enclosure panels 10 may be used for the vertical walls and coke breeze and mesh may be used underneath the slab-on-grade and above the barrel-vaulted roof 28 for EMP protection. See FIG. 6. The EMP protected interior space can be above or below grade and can also be covered with CCR for increased carbon-containing material which will afford greater protection from EMP energy.

The mesh can be welded or connected as described to other mesh layers or to the enclosure panels on all six sides to give a complete protective envelope around the building. Mesh and carbon-based materials can be used for expansion joints in conjunction with the enclosure panels Meshes can be connected in several different ways including welding, round dowel bars connecting meshes together, flat bar at the steel surface of the enclosure panels, mesh placed between a smaller and slightly larger hat or s shape channels and then either bolted or welded together. On large structures, the mesh can be assembled and connected in a patch-quilt fashion.

The disclosures of this application will be able to pass MIL-STD testing Appendix A1, Appendix 2B, and Appendix C3. The labyrinths disclosed in this application can be used in parallel numbers when structures need qualities of EMP protective passageways/airways greater than the volume of space the labyrinth will allow and still meet the MIL-STD testing requirements. Floor and roof panels can be used in this same arrangement as detailed below for more efficient EMP protection.

In addition to the variables set out above, the following variables relating to both materials and placement are considered to be within the scope of the invention:

1) Liners—6 main variables
   a. No liners
   b. Liners
   c. Liner Type—GCL
   d. Liner Type—HDPE
   e. Liner type—subtitle D specification
   f. Varying thickness for GCL and HDPE
2) Liner placement—4 main variables
   a. Top liner
   b. Bottom liner
   c. Sloped liner
   d. Combination and arrangement of different top, bottom and sloped liners
3) Encapsulation—7 main variables—11 variables
   a. Encapsulation—lime
   b. Encapsulation—cement
   c. Encapsulation—commercially available additives
   d. Encapsulation—a combination of all the above
   e. No Encapsulation—only CCR
   f. Encapsulation zones
      i. Bottom
      ii. Sides
      iii. Top
   g. Degree of encapsulation
      i. Below 2 L drinking water standards
      ii. No 2 L standards considered—just minimization as required by the federal CCR rule
      iii. States variations due to interpretation of the rule.
4) Low Leaching/Low Permeability—8 main variables—11 variables
   a. Ingredient—lime
   b. Ingredient—cement
   c. Ingredient—commercially available additives
   d. Ingredient—bentonite
   e. Ingredients—a combination of all the above
   f. No low leaching/low permeability zones
   g. Degree of low leaching/low permeability—variable
   h. Low leaching/low permeability zones
      i. Bottom
      ii. Top
      iii. Slopes
      iv. Entire structure low leaching/low permeability
5) Slope stability/CCR reinforcement—5 main variables—6 variables
   a. Zones
      i. Slopes/sides
      ii. Entire structure
   b. Grid Fabric
   c. Cement
   d. Lime
   e. RCC—Roller Compacted Concrete
6) Mesh for Low frequency EMP protection
   a. Metal Types
      i. Carbon steel
      ii. Alloys of steel and other metals based on the contribution to the EMP protection function by the alloys in combination with the carbon steel.
   b. Mesh Size—Range from #5 mesh to #6
   c. Multiple layers—single layer
7) Mesh placement
   a. Carbon Based Materials
      i. Coke Breeze
      ii. Carbon Based materials
      iii. PET Coke
      iv. Soil/gravel
8) Enclosure Panels—Concrete Materials
   a. Carbon containing
   b. No carbon in mixture
   c. Steel fibers
   d. No steel fibers
   e. Secondary pours
   f. No secondary pours
9) EMP protection
   a. Used with CCR
   b. Used with no CCR
   c. Panels on vertical—mesh for roof and slab-on-grade area e. Panels vertical and roof—mesh and carbon-based materials for slab area f. Panels vertical and slab-on-grade area—mesh and carbon based material on roof The use of engineered composite systems that are formulated and applied in building structures using common and special construction materials in unique and distinct combinations to provide EMP protection to structures according to the invention have been described with reference to specific embodiments and examples. Various details of the invention may be changed without departing from the scope of the invention. Furthermore, the foregoing description of the preferred embodiments of the invention and best mode for practicing the invention are provided for the purpose of illustration only and not for the purpose of limitation, the invention being defined by the claims.

I claim:

1. An EMP-protective composite structure, comprising:
   (a) at least one enclosure having walls, a roof, at least one ingress/egress tunnel and a foundation, each of the walls, the roof, the at least one ingress/egress tunnel and the foundation including blast-resistant protective enclosure panels and at least one layer of an EMP protective material that provides magnetic conduction, field reflection and field reflection fully-enclosing the protective enclosure panels;
   (b) a reinforced CCR cap overlying the at least one enclosure; and
   (c) a high electromagnetic protection (HEMP) protective door formed in the enclosure to absorb and deflect EMP.

2. An EMP-protective composite structure according to claim 1, wherein the EMP protective material comprises CCR.

3. An EMP-protective composite structure according to claim 1, wherein the reinforced CCR cap comprises an overlying layer of a cementitious material.

4. An EMP-protective composite structure according to claim 1, wherein the reinforced CCR cap comprises an overlying layer of a cementitious material and a layer of vegetation overlying the layer of cementitious material.

5. An EMP-protective composite structure according to claim 1, wherein the reinforced CCR cap defines an acute blast-deflecting angle with respect to a major plane of the foundation.

6. An EMP-protective composite structure according to claim 1, wherein the blast-resistant protective enclosure panels comprise a panel constructed of spaced-apart panel members of a ferrous material, panel reinforcing members extending between and electromagnetically-connecting the spaced-apart panel members, and a cementitious material in which the panel is embedded.

7. An EMP-protective composite structure according to claim 6, and including an EMP reflecting mesh embedded in the cementitious material.

8. An EMP-protective composite structure according to claim 1, wherein the blast-resistant protective enclosure panel includes an expansion joint extending along a major side thereof for joining the protective enclosure panel to a like protective enclosure panel that allows for movement of the protective enclosure panel relative to other joined protective enclosure panels due to expansion and contraction while maintaining intact EMP protective features.

9. An EMP-protective composite structure according to claim 1, and including a labyrinthine path from an exterior of the EMP-protective structure, through the reinforced CCR cap and to the at least one ingress/egress tunnel of the enclosure, the labyrinthine path configured to absorb and deflect EMP as the EMP passes along the labyrinthine path, wherein the labyrinthine path comprises a labyrinth having a plurality of right-angle turns though the EMP protective structure that provides magnetic conduction, field absorption and field reflection with respect to radiation entering the path from the exterior of the EMP-protective composite structure.

10. An EMP-protective composite structure according to claim 1, wherein the enclosure includes a plurality of structural panels joined to form enclosed spaces equipped to perform the functions selected from the group of enclosed spaces consisting of operations center, living quarters, communications, data center, mess hall, kitchen facilities, restroom, shower facility, laundry, storage for food, water, medical supplies and equipment, apparel and hygiene-related supplies and equipment, generators, battery storage, transformers, power substation, power plant SCADA system; fuel supply, storage for spare and replacement parts for operating equipment.

11. An EMP-protective composite structure, comprising:
    (a) at least one enclosure having walls, a roof, at least one ingress/egress tunnel and a foundation, each of the walls, the roof, the ingress/egress tunnel and the foundation including at least one blast-resistant protective enclosure panel and at least one layer of an EMP protective material of CCR that provides magnetic conduction, field absorption and field reflection fully-enclosing the blast-resistant protective enclosure panel, the blast-resistant panel comprising a panel constructed of spaced-apart panel members of a ferrous material, panel reinforcing members extending between and connecting the spaced-apart panel members, and a cementitious material in which the panel is embedded;
    (b) a reinforced CCR cap overlying the at least one enclosure; and
    (c) an opening communicating with a labyrinthine path from an exterior of the EMP-protective structure and through the reinforced CCR cap, the labyrinthine path configured to absorb and deflect EMP as the EMP passes along the labyrinthine path.

12. An EMP-protective composite structure according to claim 11, wherein the labyrinthine path comprises a passage having a plurality of turns though the EMP protective structure that provides magnetic conduction, field absorption and field reflection with respect to radiation entering the path from the exterior of the EMP-protective structure.

13. An EMP-protective composite structure according to claim 12, wherein the reinforced CCR cap includes an overlying layer of cementitious material and a layer of vegetation overlying the layer of cementitious material.

14. An EMP-protective composite structure according to claim 12, wherein the blast-resistant protective enclosure panel includes an expansion joint extending along a major side thereof for joining the protective enclosure panel to a like protective enclosure panel that allows for movement of the protective enclosure panel relative to other joined structural panels due to expansion and contraction while maintaining intact EMP protective features.

15. An EMP-protective composite structure according to claim 11, wherein the enclosure includes a plurality of structural panels joined to form an enclosed space equipped to perform the functions selected from the group of enclosed spaces consisting of operations center, living quarters, communications, data center, mess hall, kitchen facilities, restroom, shower facility, laundry, storage for food, water, medical supplies and equipment, apparel and hygiene-related supplies and equipment, generators, battery storage, transformers, power substation, power plant communication system; fuel supply, storage for spare and replacement parts for operating equipment.

16. An EMP-protective composite structure according to claim 11, wherein the opening includes a HEMP door positioned therein.

* * * * *